(12) United States Patent
Kim et al.

(10) Patent No.: US 11,417,804 B2
(45) Date of Patent: Aug. 16, 2022

(54) LIGHT EMITTING DEVICE PACKAGE AND LIGHT SOURCE DEVICE

(71) Applicant: SUZHOU LEKIN SEMICONDUCTOR CO., LTD., Taicang (CN)

(72) Inventors: Young Shin Kim, Seoul (KR); Soon Yong Kang, Seoul (KR); Sung Min Kong, Seoul (KR); Ju Hyeon Oh, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 114 days.

(21) Appl. No.: 16/958,043

(22) PCT Filed: Dec. 18, 2018

(86) PCT No.: PCT/KR2018/016165
§ 371 (c)(1),
(2) Date: Jun. 25, 2020

(87) PCT Pub. No.: WO2019/132386
PCT Pub. Date: Jul. 4, 2019

(65) Prior Publication Data
US 2021/0066552 A1 Mar. 4, 2021

(30) Foreign Application Priority Data
Dec. 26, 2017 (KR) .................. 10-2017-0179453
Dec. 27, 2017 (KR) .................. 10-2017-0180819

(51) Int. Cl.
*H01L 33/48* (2010.01)
*H01L 33/50* (2010.01)
(Continued)

(52) U.S. Cl.
CPC .......... *H01L 33/486* (2013.01); *H01L 33/508* (2013.01); *H01L 33/60* (2013.01); *H01L 33/62* (2013.01)

(58) Field of Classification Search
CPC ........ H01L 33/486; H01L 33/62; H01L 33/60
See application file for complete search history.

(56) References Cited

U.S. PATENT DOCUMENTS

2011/0211348 A1  9/2011  Kim
2011/0222280 A1  9/2011  Kim
2018/0315912 A1* 11/2018  Yun .................. H01L 24/17

FOREIGN PATENT DOCUMENTS

JP      2015-207732 A    11/2015
KR   10-2007-0058306 A    6/2007
(Continued)

*Primary Examiner* — Marcos D. Pizarro
*Assistant Examiner* — Antonio B Crite
(74) *Attorney, Agent, or Firm* — Birch, Stewart, Kolasch & Birch, LLP

(57) ABSTRACT

The light emitting device package disclosed in the embodiment of the invention includes first and second frames; a body disposed between the first and second frames; and a light emitting devices disposed on the first and second frames. The first frame includes a first end portion adjacent to the second frame, and the second frame includes a second end portion adjacent to the first frame and facing the first end portion, the first end portion includes a first protrusion protruding toward the second frame, and the second end portion includes a second protrusion protruding toward the first frame. The light emitting device includes first and second bonding portions disposed on the first and second protrusions. The body includes first and second reflective portions extending toward both sides of the first protrusion toward the first frame, and third and fourth reflective portions extending toward both sides of the second protrusion toward the second frame. The light emitting device may (Continued)

overlap the first to fourth reflective portions in a vertical direction.

20 Claims, 21 Drawing Sheets

(51) Int. Cl.
    *H01L 33/60* (2010.01)
    *H01L 33/62* (2010.01)
    *H01L 33/56* (2010.01)
    *F21K 9/00* (2016.01)

(56) References Cited

FOREIGN PATENT DOCUMENTS

| KR | 10-0765714 B1 | 10/2007 |
| KR | 10-1047778 B1 | 7/2011 |
| KR | 10-1064036 B1 | 9/2011 |
| KR | 20140036545 A * | 3/2014 |
| KR | 10-2017-0003198 A | 1/2017 |

* cited by examiner

LIGHT EMITTING DEVICE PACKAGE AND LIGHT SOURCE DEVICE

CROSS REFERENCE TO RELATED APPLICATIONS

This application is the National Phase of PCT/KR2018/016165 filed on Dec. 18, 2018, which claims priority under 35 U.S.C. § 119(a) to Patent Application Nos. 10-2017-0179453 and 10-2017-0180819 filed in the Republic of Korea on Dec. 26, 2017 and Dec. 27, 2017, respectively, all of which are hereby expressly incorporated by reference into the present application.

TECHNICAL FIELD

An embodiment of the invention relates to a light emitting device package and a light source device.

BACKGROUND ART

Light emitting devices such as Light Emitting Diode or Laser Diode using Group III-V or II-VI compound semiconductor materials have an advantage capable of realizing light of various wavelength bands such as red, green, blue, and ultraviolet light by development as thin film growth technology and device materials. As a light emitting device capable of providing a high output is requested, research is being conducted on a device capable of high output by applying high power. In addition, research is being conducted on a method of improving the light extraction efficiency of the light emitting device and improving the light intensity at the package stage. In addition, research is being conducted on a method of improving the bonding strength between the electrode of the light emitting device package and the light emitting device.

SUMMARY

An embodiment of the present invention provides a light emitting device package that may expose or protrude a region of each frame corresponding to each bonding portion of the light emitting device. An embodiment of the present invention provides a light emitting device package that may arrange a body on a periphery of a region of each frame corresponding to each bonding portion of the light emitting device or protrude the region in a vertical direction. An embodiment of the present invention provides a light emitting device package in which a protrusion of a frame facing each bonding portion of the light emitting device protrudes in a horizontal direction or a vertical direction.

An embodiment of the present invention provides a light emitting device package and a method of manufacturing the same, which reduces the region of discoloration of the frame and increases the reflection area by the body by reducing the region of the frames in which the light emitting devices are disposed or dispersing the frames. An embodiment of the invention provides a light emitting device package having at least one or both of a recess and a spacer on the upper portion of the body.

An embodiment of the present invention provides a light emitting device package and a method of manufacturing the same so that the bonding portion of the light emitting device is spaced apart from the conductive protrusion of the frame by disposing the support portion of the body at a height different from the height of the conductive protrusion of the frame. An embodiment of the present invention provides a light emitting device package and a method of manufacturing the same, which improve light reflection efficiency by disposing a first resin around a conductive protrusion of the frame. An embodiment of the present invention provides a light emitting device package and a method of manufacturing the same, which reduce the exposed area of the frame by disposing a reflective wall made of a resin having a multi-step structure around the lower portion of the light emitting device. An embodiment of the invention provides a light emitting device package having a protrusion or spacer to prevent the moving of the light emitting device around the light emitting device and a method for manufacturing the same. The embodiment may provide a light source device in which a light emitting device package is disposed on a board.

The light emitting device package according to an embodiment of the invention comprises a first frame and a second frame spaced apart from each other; a body disposed between the first frame and the second frame; and a light emitting device disposed on the first frame and the second frame, wherein the first frame includes a first end portion adjacent to the second frame, and the second frame includes a second end portion adjacent to the first frame and an disposed facing the first end portion, the first end portion includes a first protrusion protruding toward the second frame, and the second end portion includes a second protrusion protruding toward the first frame, the light emitting device includes a first bonding portion disposed on the first protrusion and a second bonding portion disposed on the second protrusion, the body includes first and second reflective portions extending to both side surfaces of the first protrusion toward the first frame, and third and fourth reflective portions extending to both side surfaces of the second protrusion toward the second frame, wherein the light emitting device may overlap with the first to fourth reflective portions in the vertical direction.

A light emitting device package according to an embodiment of the present invention comprises: first and second frames spaced apart from each other and including an upper surface and a lower surface thereof, respectively; a body disposed between the first frame and the second frame; and a light emitting device disposed on the body. The first frame and the second frame include a first conductive protrusion and a second conductive protrusion respectively protruding toward the light emitting devices from the upper surfaces of the first and second frames, wherein the light emitting devices may include a first bonding portion facing the first conductive protrusion and a second bonding portion facing the second conductive protrusion.

According to an embodiment of the invention, the body includes first and second recesses spaced apart from each other between the first and second frames, and the first and second recesses may include an inner portion overlap the light emitting device in a vertical direction and an outer portion extending outward from the side surface of the light emitting device. The first end portion of the first frame includes third and fourth protrusions spaced from both sides of the first protrusion and protruding in the direction of the second frame, and the second end portion of the second frame includes fifth and sixth protrusions protruding in a direction of the first frame and spaced on both sides of the second protrusion, the first reflective portion is disposed between the first and third protrusions, and the second reflective portion is disposed between the first and fourth portions, The third reflective portion may be disposed between the second and fifth protrusions, and the fourth reflective portion may be disposed between the second and sixth protrusions. A first resin is disposed between the light emitting device and the body. According to an embodiment of the present invention, the first to fourth reflective portions include a plurality of spacers respectively disposed on a lower surface of the corner portion of the light emitting device, and the plurality of spacers are spaced apart the light emitting devices from the upper surfaces of the first and second protrusions. According to an embodiment of the present invention, a conductive portion may be disposed between the first bonding portion of the light emitting device and the first protrusion, and between the second bonding portion of the light emitting device and the second protrusion.

According to an embodiment of the invention, the body may include a support portion protruding from the first and second protrusions. The support portion of the body has a first height based on the upper surface of the first frame, and the first and second conductive protrusions have a second height based on the upper surface of the first frame, the first height and the second heights may be different from each other. The upper surface of the first frame and the upper surface of the second frame may be disposed on the same plane with each other, and the first and second conductive protrusions have first and second flat surfaces with a flat upper surface, and a width of the first and second bonding portions and width of the first and second flat surfaces may be different from each other. According to an embodiment of the invention, the first height is disposed higher than the second height, and the upper surface of the support portion may be disposed higher than the upper surface of the first and second bonding portions based on the upper surface of the first frame. The light emitting device package may include a first conductive portion disposed between the first bonding portion and the first conductive protrusion, and a second conductive portion between the second bonding portion and the second conductive protrusion, and a thickness of the first and second conductive portions may be equal to the difference between the first and second heights.

According to an embodiment of the invention, an upper body is disposed around an upper portion of the body and the first and second frames and has a cavity therein, the inner surface of the cavity may include a reflective wall having a flat upper surface and extending in the inner direction. A second resin includes in a periphery of the lower portion of the light emitting device, and the reflective wall has an angle greater than an inclination angle of the inner surface of the cavity, and the second resin is disposed around the first and second conductive protrusions and may protrude along the reflective wall.

According to an embodiment of the present invention, a sub-reflective wall extending inward from the reflective wall is provided at a lower portion of a side of the cavity, and an upper surface of the sub-reflective wall has a lower height than a height of the upper surface of the reflective wall, and upper surfaces of the reflective wall and the sub-reflective wall is flat, and an area of the flat upper surface of the reflective wall may be larger than an area of the flat upper surface of the sub-reflective wall. The height of the sub-reflective wall is lower than the lower surface of the light emitting device and is disposed higher than the upper surface of the first and second conductive protrusions, and the sub-reflective wall may be connected to the support portion.

Light source device according to an embodiment of the invention, a circuit board; and one or more light emitting device packages on the circuit board.

Advantageous Effects

According to an embodiment of the invention, by increasing the area of the body disposed under the light emitting device and reducing the area of the frame, it is possible to reduce discoloration of the frame, improve reflection efficiency by the body, and prevent a decrease in luminous flux.

According to an embodiment of the invention, the end portions of the frames corresponding to each other are divided into a plurality and are be coupled with the body, thereby dispersing thermal stress and preventing crack defects in the solder material due to thermal deformation of the body. According to an embodiment of the present invention, at least one recess is provided on the body, thereby improving adhesion between the resin disposed in the recess and the light emitting device and preventing the light emitting device from tilting.

According to the exemplary embodiment of the invention, the supporting force of the light emitting device may be improved and the heat dissipation characteristics and heat conduction characteristics may be improved by a conductive portion disposed between the bonding portion of the light emitting device and the frame. According to an embodiment of the invention, by extending the side surface of the cavity having a multi-stepped structure around the lower periphery of the light emitting device in the direction of the light emitting device, reflection efficiency may be improved.

According to an embodiment of the invention, there is an advantage that may improve the light extraction efficiency and electrical properties and reliability. In addition, by bonding the light emitting device with a resin, it is possible to prevent a problem that the bonding portion of the light emitting device is re-melted by external heat.

DETAILED DESCRIPTION

Figure 1:
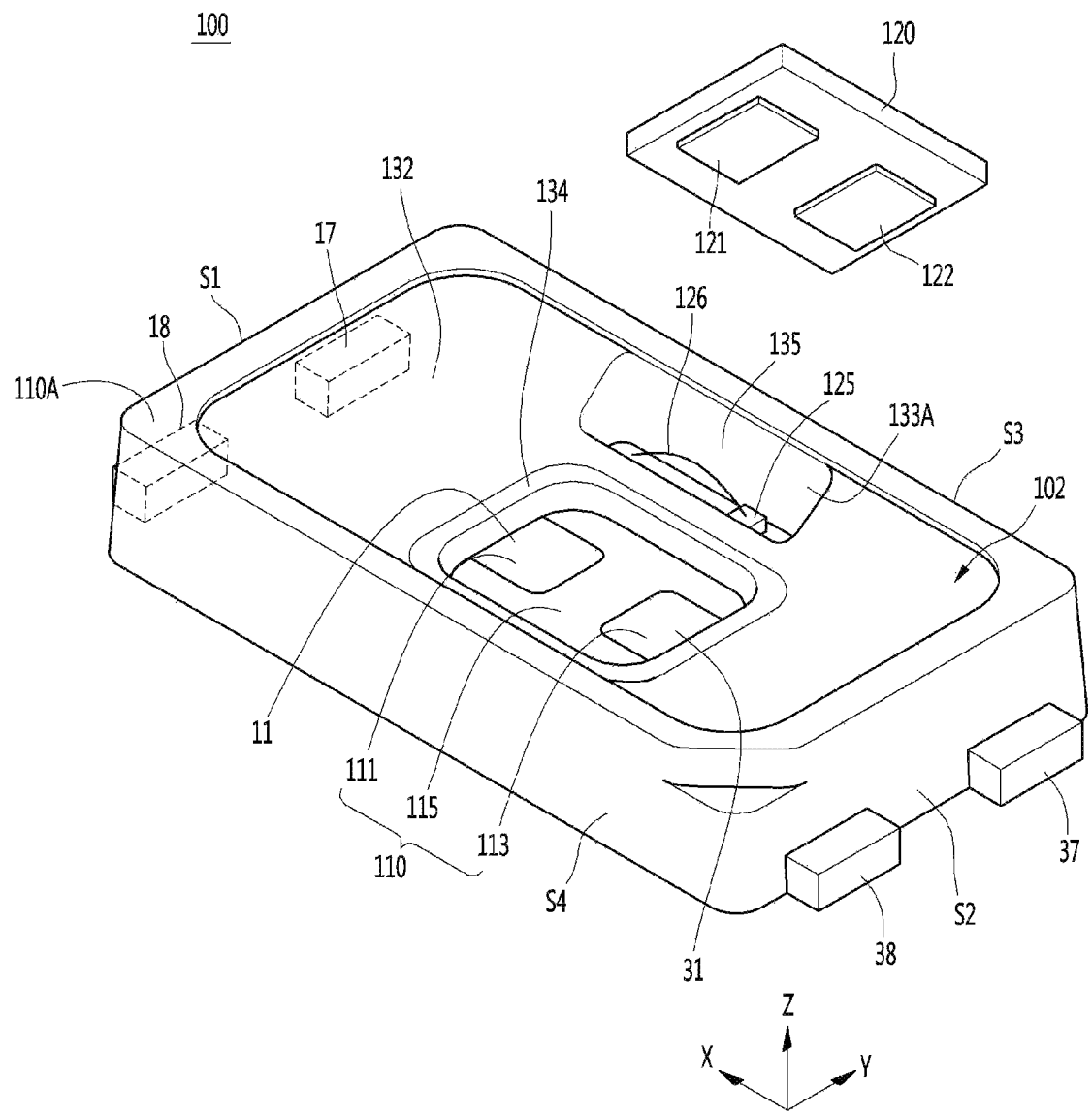
FIG. 1 is an exploded perspective view of a light emitting device package according to a first embodiment of the invention.

An embodiment will be described with reference to accompanying drawings. In the description of the embodiments, it will be understood that, when a layer (or film), a region, a pattern, or a structure is referred to as being "on" or "under" another substrate, another layer (or film), another region, another pad, or another pattern, it may be "directly" or "indirectly" over the other substrate, layer (or film), region, pad, or pattern, or one or more intervening layers may also be present. Such a position of the layer has been described with reference to the drawings, but the embodiments are not limited thereto.

First Embodiment

Referring to FIGS. 1 to 6, a light emitting device package 100 may include a package body 110 and a light emitting device 120. In the light emitting device package 100, a length of the first direction X may be greater than a length of the second direction Y. The length of the first direction of the package may be greater than the length of the first direction of the package body 110, and the length of the first direction X of the package body 110 may be equal to or greater than the length of the second direction Y. In the following description, the first direction is the X direction, the second direction is the Y direction orthogonal to the X direction, and a third direction may be a Z direction or the vertical direction orthogonal to the X and Y directions. The first direction may be a direction of a longer side of the sides of the light emitting device 120. In the first direction, both short sides of the light emitting device 120 may be disposed on opposite sides, and in the second direction, both long sides of the light emitting device 120 may be disposed on opposite sides. The package body 110 may include first and second side surfaces S1 and S2 extending in the second direction, and third and fourth side surfaces S3 and S4 extending in the first direction. The first and second side surfaces S1 and S2 are opposite sides from each other, and the third and fourth side surfaces S3 and S4 are opposite sides from each other, and an interval between the first and second side surfaces S1 and S2 is the length of the third and fourth sides S3 and S4 in the first direction, and an interval between the third and fourth sides S3 and S4 mat be the length of the first and second side surfaces S1 and S2 in the second direction. Each side surface S1, S2, S3, and S4 may be the outer side of the body 115 and may be disposed vertically or inclined.

The package body 110 may include a body 115 and a plurality of frames. The plurality of frames may include, for example, a first frame 111 and a second frame 113 spaced apart from each other in the first direction. The body 115 is disposed between the first and second frames 111 and 113 and may be coupled to the frames 111 and 113. The body 115 may be disposed around each frame, and may function as an electrode separator or may be referred to as an insulating body. The body 115 may be disposed on the first and second frames 111 and 113. The body 115 may provide a cavity 102 having an inner surface 132 inclined above the first and second frames 111 and 113. The package body 110 may be provided in a structure with a cavity 102, or may be provided in a flat structure without a cavity 102. The body 115 may include an upper body 110A having a cavity 102, and the body 115 and the upper body 110A may be formed of the same material or may be different materials. The upper body 110A may be integrally formed with the body 115 or separately formed. For example, the body 115 may be a resin material or an insulating resin material. The body 115 may be formed of at least one of PPA (Polyphthalamide), PCT (Polychloro Triphenyl), LCP (Liquid Crystal Polymer), PAST (Polyamide9T), silicone, epoxy, EMC (Epoxy molding compound), SMC (Silicon molding compound), ceramic, PSG (photo sensitive glass), and sapphire ($Al_2O_3$). The resin material of the body 115 may include fillers of high refractive material such as $TiO_2$ and $SiO_2$. The body 115 may be formed of a thermoplastic resin, and the thermoplastic resin is a material that is re-hardened when heated and cooled, when the frames 111 and 113 and materials in contact with it expand or contract by heat, the body 115 may act as a buffer. When the body 115 is buffered, conductive portions such as solder-based paste, Ag-based paste, and SAC (Sn-Ag-Cu)-based paste may be prevented from being damaged. In the package, a coefficient of thermal expansion (CTE) due to thermal expansion and contraction may have a first direction greater than a second direction. The body 115 may include a PCT or PPA material, and the PCT or PPA material has a high melting point and is a thermoplastic resin.

Figure 4:
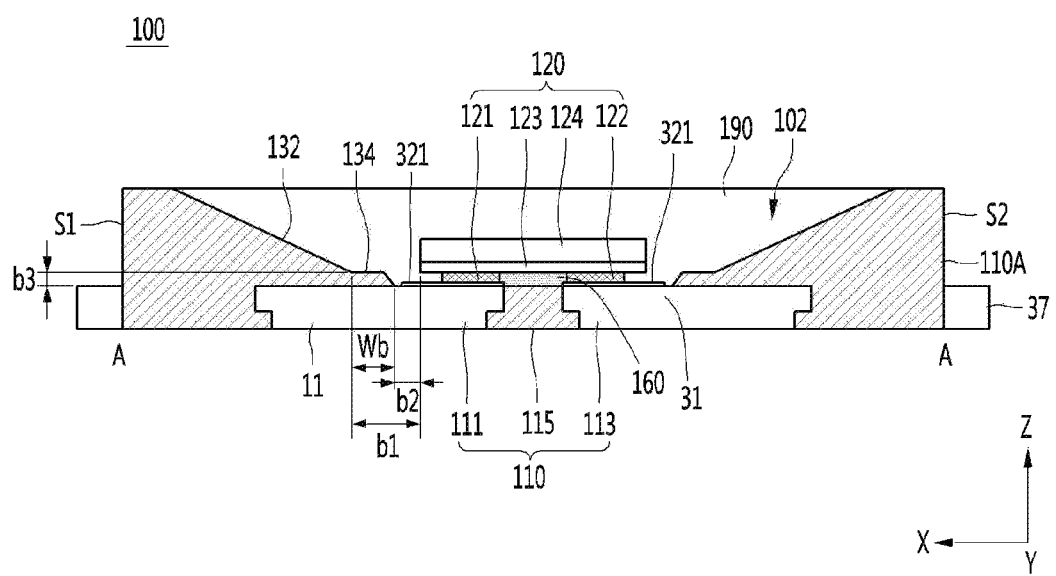
FIG. 4 is a cross-sectional view taken along A-A side of the light emitting device package in FIG. 2.

As shown in FIG. 4, the inner surface 132 of the cavity 102 may be inclined at different angles from the first direction and the second direction. The inner surface 132 is inclined at a second angle with respect to a horizontal straight line, and the inner surface of the reflective wall 134 extending to a lower portion of the side surface of the cavity 102 is inclined at a first angle and faces to a side of the light emitting device 120, and the upper surface of the reflective wall may be formed as a flat surface. The first angle may be greater than the second angle with respect to the horizontal straight line. The first angle of the reflective wall 134 may be formed at an angle in the range of 45 degrees or more, for example, 45 degrees to 70 degrees, so that a material such as burr is not formed. The thickness (b3, FIG. 4) of the reflective wall 134 may be 100 μm or more, for example, in a range of 100 to 200 μm, and when the thickness b3 is smaller than the range, the reflective wall 134 is peeled off. When it may be lost and thicker than the above range, the improvement in light efficiency may be negligible. The interval b2 in the first direction between the reflective wall 134 and the light emitting device 120 may be 400 μm or less, for example, in a range of 200 to 400 μm, and the interval in the second direction may be equal to or smaller than the interval b2. The maximum distance (b1) from the side of the light emitting device 120 to the upper surface of the reflective wall 134 is 700 μm or less, for example, in the range of 450 to 700 μm, thereby reducing light loss. The width Wb in the first direction of the reflective wall 134 may be 230 μm or less, for example, in a range of 180 to 230 μm, and the width in the second direction may be equal to or smaller than the width Wb in the first direction and may be, for example, 200 μm or less, for example, in a range of 130 to 200 μm. The widths of the first and second directions of the reflective wall 134 may consider distribution of a light directing angle by the cavity 120 or provide a space for a fixture for an under-fill process.

Figure 2:
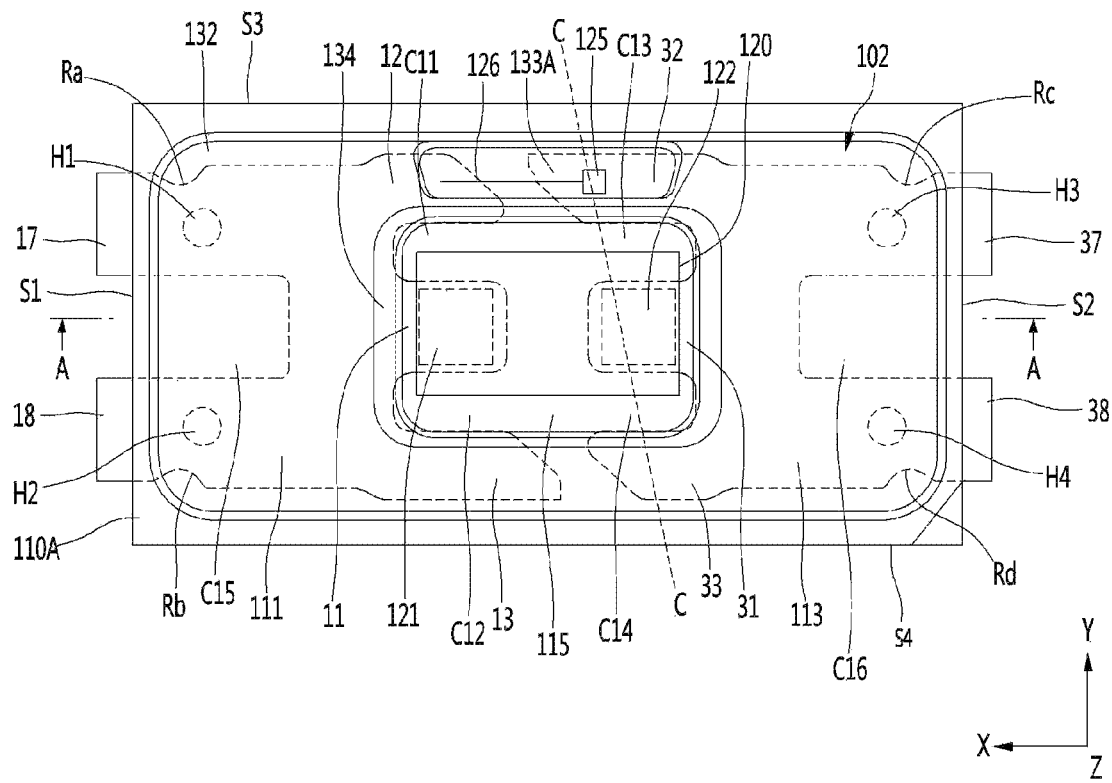
FIG. 2 is a plan view of the light emitting device of the light emitting device package in FIG. 1.
Figure 3:
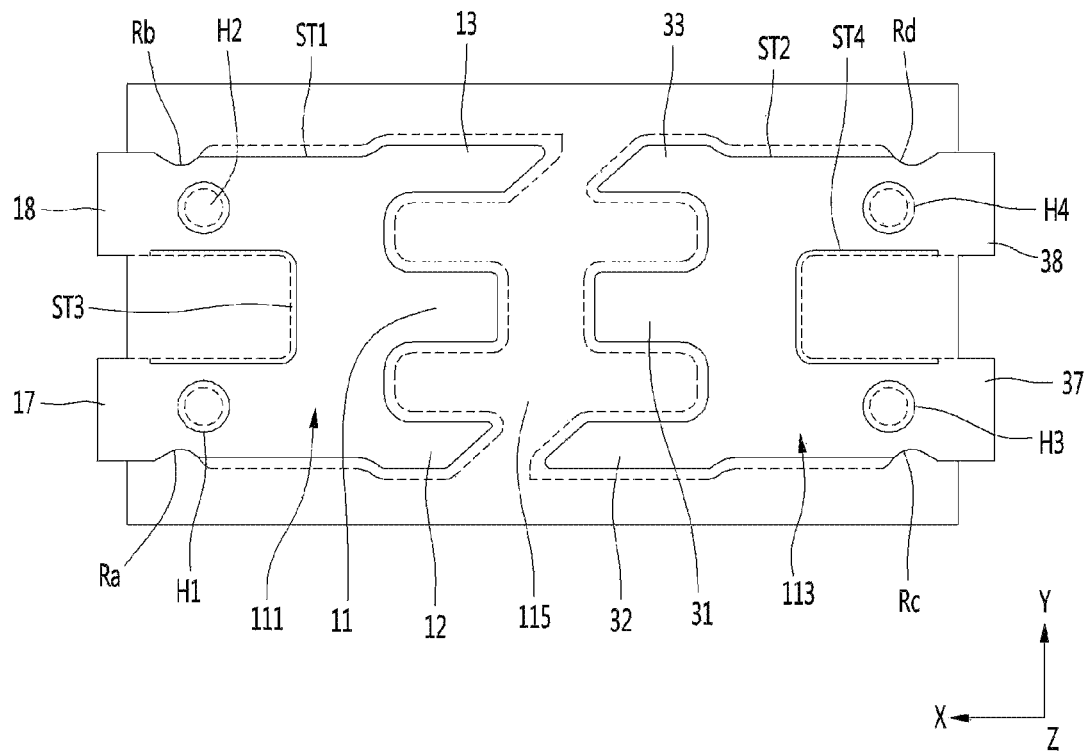
FIG. 3 is a bottom view of the light emitting device package in FIG. 2.

The first and second frames 111 and 113 may be provided as conductive or metal frames. The frames 111 and 113 are metals, for example, as least one selected from copper (Cu), titanium (Ti), nickel (Ni), gold (Au), chromium (Cr), tantalum (Ta), platinum (Pt), tin (Sn), silver (Ag), and may be formed in a single layer or multiple layers. The thicknesses of the first and second frames 111 and 113 may be 100 μm or more, for example, in a range of 100 to 300 μm, thereby preventing heat and electric conductivity from being lowered. As shown in FIGS. 2 to 4, the first extension portions 17 and 18 of the first frame 111 may extend in the direction of the first side surface Si or protrude outward than the first side surface S1. The second extension portions 37 and 38 of the second frame 113 may extend in the direction of the second side surface S2 or protrude outward from the second side surface S2. The first extension portion 17 and 18 and the second extension portion 37 and 38 may be arranged in one or a plurality. The outer surfaces of the first and second frames 111 and 113 may be coupled to the body 115 in step structures ST1 and ST2. The outer sides of the first extension portions 17 and 18 and the second extension portions 37 and 38 may be coupled to the body 115 in stepped structures ST3 and ST4. A region between the first extension portions 17 and 18 and a region between the second extension portions 37 and 38 may be partially disposed of the body 115, respectively. The stepped structures ST1, ST2, ST3, and ST4 may increase the coupling area between the frames 111 and 113 and the body 115, and prevent moisture penetration. A plurality of holes H1, H2, H3, and H4 may be disposed inside the extension portions 17, 18, 37, and 37 of each of the frames 111 and 113, and the concave portions Ra, Rb, Rc, and Rd may concavely disposed on the outside of the extension portions 17, 18, 37, and 37. The concave portions Ra, Rb, Rc, and Rd and the holes H1, H2, H3, and H4 may be disposed in a region overlapping the body 115 to enhance the bonding force with the body and suppress moisture penetration.

As shown in FIGS. 2 and 3, the first end portion of the first frame 111 may include a plurality of protrusions 11, 12 and 13 protruding in a direction of the second frame 113 or in a direction of the second side surface S2. The second end portion of the second frame 113 may include a plurality of protrusions 31, 32 and 33 protruding in the direction of the first frame 111 or in a direction of the first side surface S1. The first frame 111 may include a first protrusion 11 on the center region and the second frame 113 may include a second protrusion 31 on the center region. The first frame 111 may include a third protrusion 12 adjacent to the third side surface S3 of the body 115 and a fourth protrusion 13 adjacent to the fourth side surface S4. The second frame 113 may include a fifth protrusion 32 adjacent to the third side surface S3 of the body 115 and a sixth protrusion 33 adjacent to the fourth side surface S4. The first and second protrusions 11 and 31 may overlap the light emitting device 120 in the vertical direction Z. The first protrusion 11 may be disposed between the third and fourth protrusions 12 and 13. The second protrusion 31 may be disposed between the fifth and sixth protrusions 32 and 33. The third protrusion 12 may be disposed between the first protrusion 11 and the third side surface S3, the fourth protrusion 13 may be disposed between the first protrusion 11 and the fourth side surface S4. The fifth protrusion 32 may be disposed between the second protrusion 31 and the third side surface S3. The sixth protrusion 33 may be disposed between the second protrusion 31 and the fourth side surface S4. The first, third and fourth protrusions 11, 12 and 13 may overlap in the second direction. The second, fifth and sixth protrusions 31, 32 and 33 may overlap in the second direction. The third and fifth protrusions 12 and 32 may be spaced apart from the third side surface S3, and the fourth and sixth protrusions 32 and 33 may be spaced apart from the fourth side surface S4. The second, fifth and sixth protrusions 31, 32 and 33 may overlap in the second direction. Each of the first, third and fourth protrusions 11, 12 and 13 and the second, fifth and sixth protrusions 31, 32 and 33 may be exposed at the bottom of the body 15. The outer portions of the third and fifth protrusions 12 and 32 and the fourth and sixth protrusions 13 and 33 may overlap the upper body 110A in a vertical direction. Here, the first and second protrusions 11 and 31 are disposed at the center of the bottom of the cavity 102, and the inner regions of the third to sixth protrusions 12, 13, 32 and 33 may be spaced apart from to a bottom of cavity 102 or partially exposed to the bottom of the cavity 102. The area of the upper surface of the first or second protrusions 11 and 31 may be larger than that of the third and fourth protrusions 12 and 13 or the area of the upper surfaces of the fifth and sixth protrusions 32 and 33, thereby improving the heat dissipation efficiency of the light emitting device 120. The upper surface area of the light emitting device 120 at the bottom of the cavity 102 may be greater than the sum of the upper surface areas of the frames 111 and 113 disposed on the bottom of the cavity 102 or the sum of the upper surface areas the first and second protrusions 11 and 31. The number of each of the first and second protrusions 11 and 31 may be the same as the number of light emitting devices 120.

Each of the first and second protrusions 11 and 31 may face each of the bonding portions 121 and 122 of the light emitting device 120. As shown in FIG. 4, the conductive portion 321 is disposed between the first frame 111 and the first bonding portion 121 and between the second frame 113 and the second bonding portion 122 and may electrically connected. By arranging a resin material around the conductive portion 321, diffusion of the conductive portion provided in a liquid state is suppressed, and thus a uniform and thick thickness may be provided.

The protrusions 11, 12, 13 of the first frame 111 and the protrusions 31, 32, 33 of the second frame 113 are disposed so that at least a portion overlaps in the second direction, a rigidity of the package body 110 or the body 115 may be enhanced. For example, an end portion of the fourth protrusion 13 may protrude more in a direction of the second frame than the first and third protrusions 11 and 12. End portion of the fifth protrusions 34 may protrude more in a direction of the first frame than the second and sixth protrusions 31 and 33. The end portion of the fourth protrusion 13 and the end portion of the fifth protrusion 32 may overlap in the second direction. The fourth protrusion 13 and the fifth protrusion 32 are disposed to overlap in the second direction in regions opposite to each other based on the first and second protrusions 11 and 31, so that a center rigidity of the body 115 may be enhanced.

Figure 19:
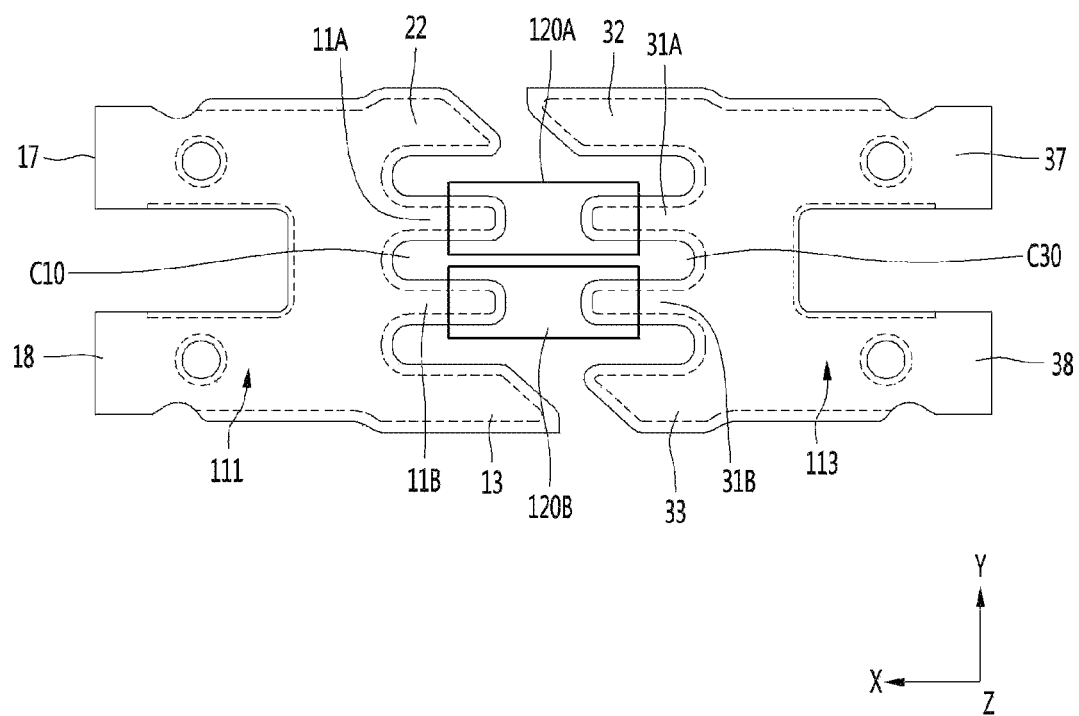
FIG. 19 is an example of a top view showing the structure of the frames of FIGS. 17 and 18.
Figure 20:
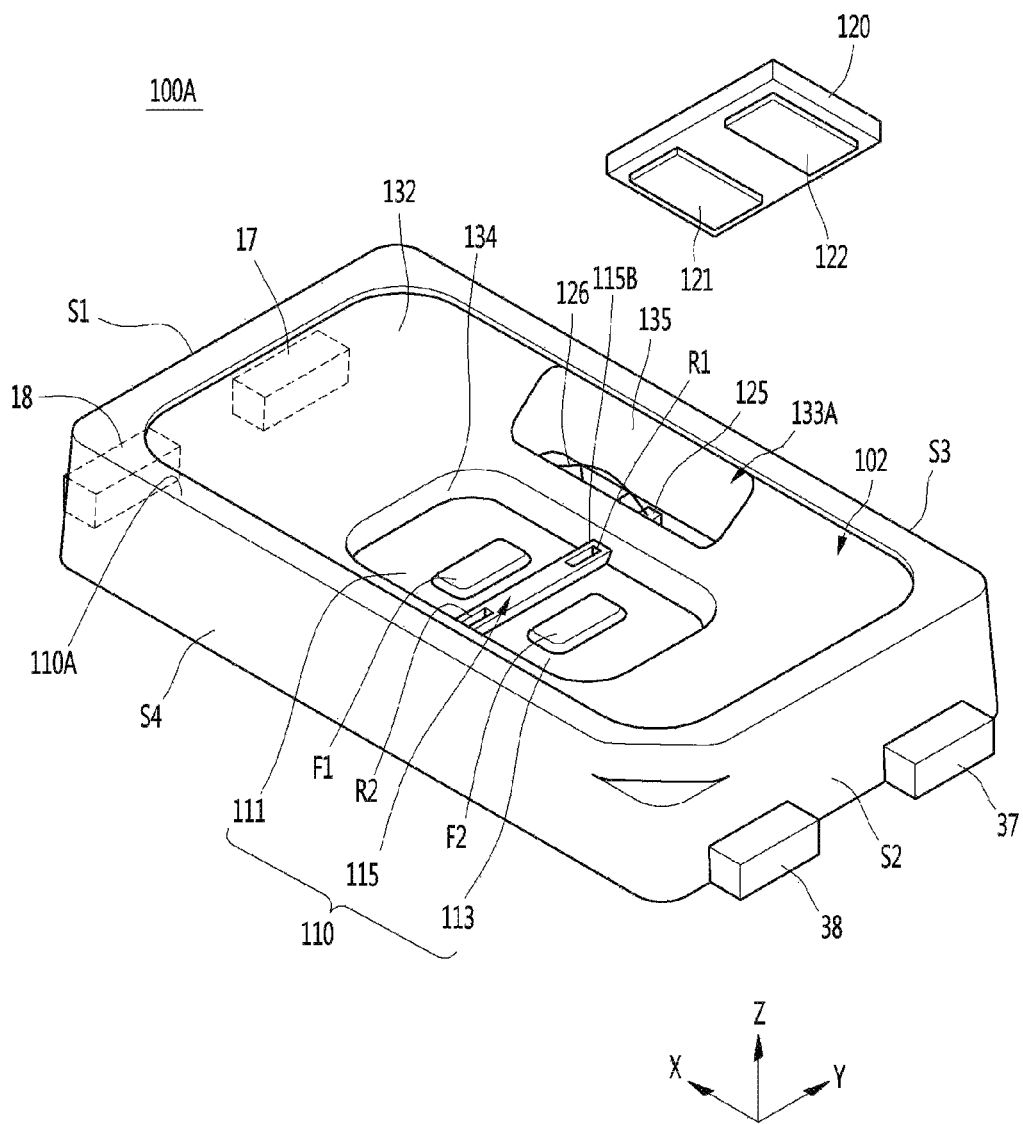
FIG. 20 is an exploded perspective view of a light emitting device package according to a second embodiment of the present invention.

As another example, as shown in FIG. 19, four or more protrusions may be disposed on at least one or both of the first and second frames 111 and 113. As another example, in order to increase the area of the upper surface of the body 115 at the bottom of the cavity 102, the third and fourth protrusions 12 and 13, and the fifth and sixth protrusions 32 and 33 may be disposed under the upper body 110A and may not be exposed to the bottom of the cavity 102. Accordingly, the area of the body 115 may be provided larger than the area of the frames 111 and 113 based to the bottom of the cavity 102. Since the reflective properties of the body 115 are higher than the reflective properties of the frames 111 and 113, the light reflection efficiency at the bottom of the cavity 102 may be improved.

Figure 5:
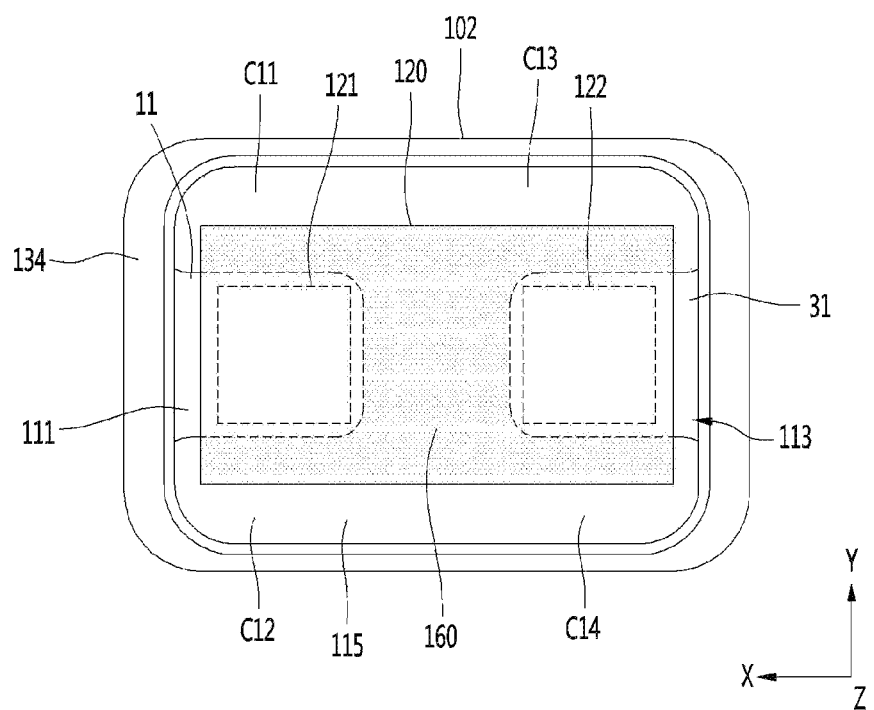
FIG. 5 is a view showing a body of the light emitting device package.
Figure 6:
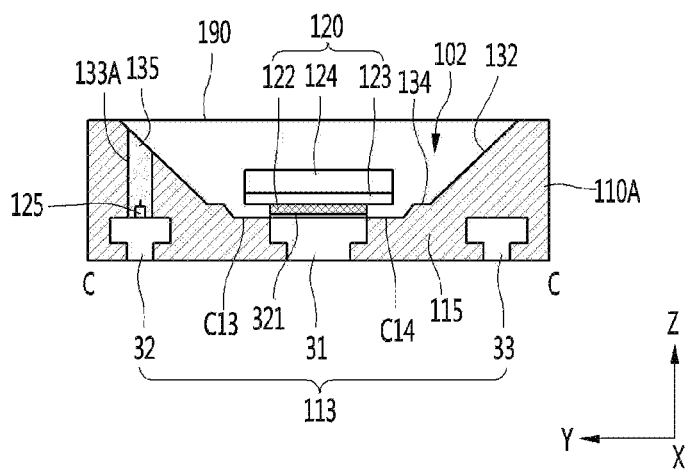
FIG. 6 is a cross-sectional view seen from C-C side of the light emitting device package of FIG. 1.

As shown in FIGS. 2 and 5, the reflective portion of the body 115 may disposed between the protrusions 11, 12, and 13 of the first frame 111 and the protrusions 31, 32, and 33 of the second frame 113, respectively. The body 115 includes a first reflective portion C11 extending into the region between the first and third protrusions 11 and 13, a second reflective portion C12 extending into the region between the first and fourth protrusions 11 and 13, a third reflective portion C13 extending into the region between the second and fifth protrusions 31 and 32, and a fourth reflective portion C14 extending into the region between the second and sixth protrusions 31 and 33 Each of the reflective portions C11, C12, C13, and C14 is coupled to a concave curved or rounded area of the frame 111, 113, and the contact area with each protrusion 11, 12, 13, 31, 32, and 33 is increased and may suppress moisture penetration.

The first and third reflective portions C11 and C13 overlap in the first direction and extend in opposite directions, and the second and fourth reflective portions C12 and C14 may overlap in the first direction and may be extended in opposite directions to each other. The first protrusion 11 is disposed between the first and second reflective portions C11 and C12, and the second protrusion 31 may be disposed between the third and fourth reflective portions C13 and C14. The first and second reflective portions C11 and C12 contact the outer surface of the first protrusion 11, and the third and fourth reflective portions C13 and C14 may be contacted with outer surfaces of the second protrusion 31. Light reflectivity may be improved by a reflective portion of a body material disposed on the bottom of the cavity 102. Each of the reflective portions C11, C12, C13, and C14 may overlap the light emitting device 120 in the vertical direction, and may reflect light traveling in the lateral or downward direction from the light emitting device 120. Each of the reflective portions C11, C12, C13, and C14 may be formed of the same resin material as the body 115 and may disposed in a dispersed region, thereby preventing the conductive portion 321 from diffusing. Since the reflective portions C11, C12, C13, and C14 prevent diffusion of the conductive portion 321, the bonding force of the conductive portion 321 disposed between the light emitting device 120 and the frames 111 and 113 may be improved. Each of the reflective portions C11, C12, C13, and C14 may serve as a dam preventing diffusion of the conductive portion 321, and the light emitting device 120 may include the first and second protrusions 11 and 31 may be prevented from being distorted. The conductive portion 321 may include a conductive paste, for example, a solder-based paste, an Ag-based paste or a SAC (Sn—Ag—Cu) series. An embodiment of the invention may reduce the problem of thermal deformation of the body due to thermal expansion by reducing the area of the frames. Due to the reduction in thermal deformation of the body, crack generation of the conductive portion may be reduced. In addition, it is possible to reduce the problem of discoloration of the surface of the frame by improving the reflection efficiency by the material of the reflective portions C11, C12, C13, and C14 and improving the adhesion with the molding portion 190.

The light emitting device 120 may include a first bonding portion 121, a second bonding portion 122 and a light emitting structure 123. The light emitting device 120 may include a substrate 124 on the light emitting structure 123. The light emitting device 120 may have a length in the first direction equal to or longer than the length in the second direction. The first bonding portion 121 is disposed between the light emitting structure 123 and the first frame 111, and the second bonding portion 122 may be disposed between the light emitting structure 123 and the second frame 113. The first and second bonding portions 121 and 122 may be a metal material or a conductive material. For example, the first and second bonding portions 121 and 122 may be one material or alloy selected from group consisting of Ti, Al, In, Ir, Ta, Pd, Co, Cr, Mg, Zn, Ni, Si, Ge, Ag, Ag alloy, Au, Hf, Pt, Ru, Rh, ZnO, IrOx, RuOx, NiO, RuOx/ITO, Ni/IrOx/Au, Ni/IrOx/Au/ITO and may be formed of single layer or multi-layers. The light emitting structure 123 may include a first conductive semiconductor layer, a second conductive semiconductor layer, and an active layer disposed between the first and second conductive semiconductor layers. The first bonding portion 121 may be electrically connected to the first conductive semiconductor layer. The second bonding portion 122 may be electrically connected to the second conductive semiconductor layer. The substrate 124 is a light-transmitting material and may be formed of an insulating material or a semiconductor material. The light emitting structure 123 may be provided as a compound semiconductor, for example, may be provided as a compound semiconductor of Group II-Group VI or a Group III-Group V. The first and second conductive semiconductor layers are formed of, for example, a semiconductor material having a composition formula of $In_xAl_yGa_{1-x-y}N$ ($0 \le x \le 1$, $0 \le y \le 1$, $0 \le x+y \le 1$), and may include at least one of GaN, AlN, AlGaN, InGaN, InN, InAlGaN, AlInN, AlGaAs, GaP, GaAs, GaAsP, AlGaInP. The first conductive semiconductor layer may be an n-type semiconductor layer, and the second conductive semiconductor layer may be a p-type semiconductor layer. The active layer may be embodied as at least one of compound semiconductors of Group III-V or Group II-VI. The active layer may include a plurality of well layers and a plurality of barrier layers, for example, may include at least one selected from the group including InGaN/GaN, GaN/AlGaN, AlGaN/AlGaN, InGaN/AlGaN, InGaN/InGaN, AlGaAs/GaAs, InGaAs/GaAs, InGaP/GaP, AlInGaP/InGaP, InP/GaAs. The light emitting device 120 may include one or a plurality of light emitting cells therein. The light emitting cell may include at least one of n-p junction, p-n junction, n-p-n junction, and p-n-p junction. The plurality of light emitting cells may be connected to each other in series within one light emitting device. Accordingly, the light emitting device may have one or a plurality of light emitting cells, and when n (n is 2 or more) light emitting cells are disposed in one light emitting device, the light emitting device may be driven with a driving voltage of n times.

The light emitting device 120 may be disposed on the body 115 and the first and second frames 111 and 113. The first and second bonding portions 121 and 122 of the light emitting device 120 may be disposed on the first and second protrusions 11 and 31 of the first and second frames 111 and 113. The light emitting device 120 may be disposed in the cavity 102, and the upper body 110A may be arranged around the light emitting device 120. The sub-cavity 133A may be disposed on a side adjacent to the third side or the fourth side among the inner surfaces of the cavity 102. A portion of the first and second frames 111 and 113 may be exposed on the bottom of the sub-cavity 133A, and a protective device 125 is disposed on any one of the exposed frames, and electrically connected to other frames or may be connected by wire 126. A reflective resin 135 is disposed in the sub-cavity 133A, and the reflective resin 135 seals the protective device 125 and the wire 126. The reflective resin 135 is formed of a resin material such as silicone or epoxy, and may include a high refractive filler therein. The protective device 125 may be disposed on the third protrusion 12 of the first frame 111 and the fifth protrusion 32 of the second frame 113. The sub-cavity 133A may be connected to the cavity 102 or separated by a resin wall.

As shown in FIGS. 4 and 5, the first resin 160 may be disposed between the body 115 and the light emitting device 120. The first resin 160 may include an adhesive material and/or a reflective material. The first resin 160 may be disposed between the upper surface of the body 115 and the lower surface of the light emitting device 120, and may overlap the light emitting device 120 in a vertical direction. For example, the first resin 160 may include at least one of an epoxy-based material, a silicon-based material, an epoxy-based material, and a hybrid material including a silicon-based material. For example, the first resin 160 may include white silicone, and may include a filler such as $TiO_2$, $SiO_2$, or $Al_2O_3$ therein. The first resin 160 may be adhered to the light emitting device 120 and the body 115. The first resin 160 is disposed between the first bonding portion 121 and the second bonding portion 122 of the light emitting device 120 and may be in contact with the first and second bonding portions 121 and 122. The first resin 160 may be adhered to a region between the lower surface of the light emitting device 120 and the frames 111 and 113 and a region between the light emitting device 120 and the body 115. Accordingly, the first resin 160 may enhance the lower adhesive force and the supporting force of the light emitting device 120. When bonding the light emitting device 120 on a circuit board, the first resin 160 may prevent the light emitting device 120 from being tilted by the conductive portion 321 and diffuse light and improve the reflection efficiency.

Each of the frames 111 and 113 and each of the bonding portions 121 and 122 may be combined by an intermetallic compound layer. The first and second protrusions 11 and 31 of each of the frames 111 and 113 and the bonding portions 121 and 122 may be combined by an intermetallic compound layer. The intermetallic compound may include at least one of $Cu_xSn_y$, $Ag_xSn_y$, and $Au_xSn_y$, and x may satisfy the conditions of $0<x<1$, $y=1-x$, $x>y$. The intermetallic compound layer may include a material constituting the conductive portion 321. The conductive portion 321 disposed on the first protrusion 11 of the first frame 111 is in direct contact with the lower surface of the first bonding portion 121, and is electrically connected to the first bonding portion 121. The conductive portion 321 disposed on the second protrusion 31 of the second frame 113 is in direct contact with the lower surface of the second bonding portion 122, and may be electrically connected to the second bonding portion 122. The conductive portion 321 may include at least one of Ag, Au, Pt, Sn, Cu, Zn, In, Bi, and Ti or an alloy thereof. The conductive portion 321 is a solder paste, and may be formed by mixing powder particles or particle particles and flux. The solder paste may include Sn—Ag—Cu, and the weight percentage of each metal may vary. The conductive portion 321 may include SAC (Sn—Ag—Cu) or SAC-based material. The conductive portion 321 may include a solder-based paste or a silver-based paste. The bonding portions 121 and 122 of the light emitting device 120 may be formed of an intermetallic compound (IMC) layer between the conductive portion 321 and the frames 111 and 113, in a heat treatment process of a material constituting the conductive portion 321 and a process of forming the conductive portion 321 or after the conductive portion 321 is provided. Here, an alloy layer may be formed by bonding between the material constituting the conductive portion 321 and the metal of the frames 111 and 113, so that the alloy layer is physically and electrically coupled to the conductive portion 321 and the frame 111 and 113. The alloy layer may include at least one of AgSn, CuSn, and AuSn. When the frames 111 and 113 have a multi-layer structure having a base layer and a plating layer on the surface of the base layer, the alloy layer may be formed between the conductive portion 321 and at least one layer of the frames 111 and 113. The alloy layer may be formed by bonding between the materials constituting the conductive portion 321 and the metal layers of the frames 111 and 113. When the conductive portion 321 includes at least one of Sn and Ag and the metal layer of the bonding portion or frame includes at least one of Ag, Au, Sn and Cu, the intermetallic compound layer may be formed of at least one of AgSn, AuSn, CuSn, or AgSn. The intermetallic compound layer may have a higher melting point than other bonding materials. The heat treatment process in which the metallic compound layer is formed may be performed at a lower temperature than the melting point of a common bonding material. Therefore, when the light emitting device package is bonded to the main substrate through a reflow process, re-melting does not occur, so that the electrical connection and physical bonding force are not deteriorated. In an embodiment, the package body may be prevented from being damaged or discolored because the package body is not exposed to high temperatures in the process of manufacturing the light emitting device package, and the selection range for the material constituting the body 115 may be widened.

The molding portion 190 may be disposed on the light emitting device 120 and the first and second frames 111 and 113. The molding portion 190 may be disposed in the cavity 102. The molding portion 190 may include an insulating material, or may include a wavelength conversion means therein. For example, the molding portion 190 may include at least one of phosphors or quantum dots. The light emitting device 120 may emit light of blue, green, red, white, infrared, or ultraviolet light. The phosphor or the quantum dot may emit blue, green, and red light. The molding portion 190 may not be formed.

In the present invention, since the distance between the side of the light emitting device 120 and the reflective wall 134 of the cavity 102 is arranged narrowly, a separate reflective resin may not be formed to the region between the light emitting device 120 and the side of the cavity 102. The exposed areas of the frames 111 and 113 may be reduced, thermal deformation caused by the frames may be reduced, and crack generation of the conductive portion 321 may be suppressed.

Figure 7:
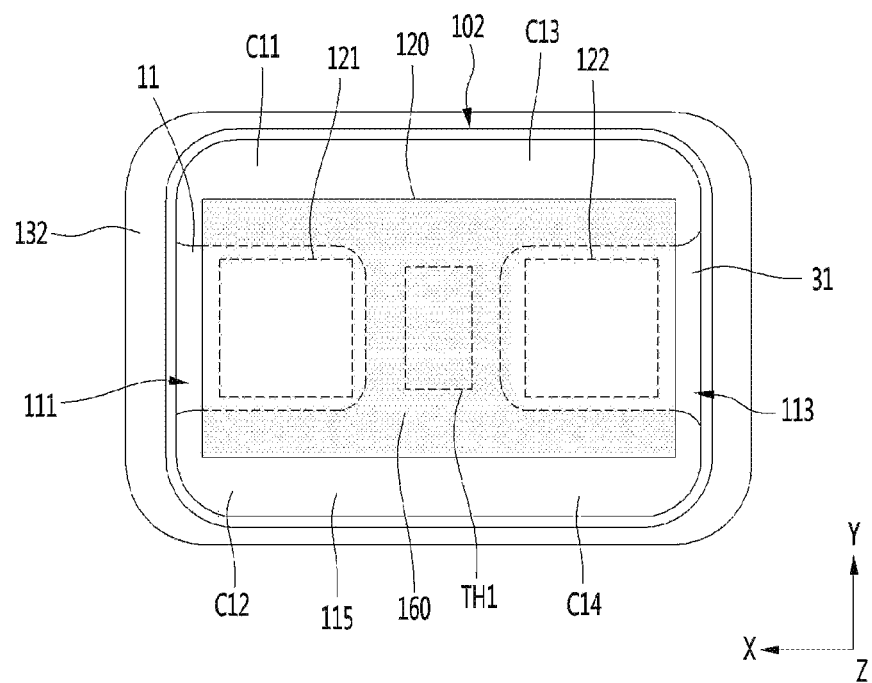
FIG. 7 is a view showing a region of the first resin in the light emitting device package of FIG. 2.
Figure 8:
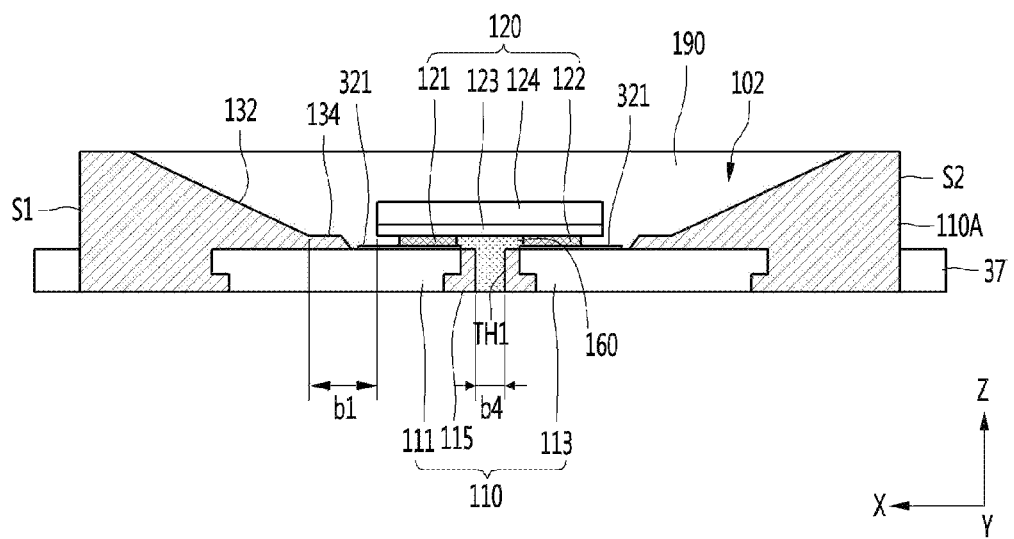
FIG. 8 is a cross-sectional side view showing a through hole of the body as another example of the light emitting device package of FIG. 7.

FIGS. 7 and 8 are other examples of the light emitting device package according to the first embodiment. Referring to FIGS. 7 and 8, the through hole TH1 may be disposed in the body 115 disposed between the first and second frames 111 and 113. The through hole TH1 may have the same depth as the thickness of the body 115 or may penetrate from the upper surface to the lower surface of the body 115. The lower surface area of the through hole TH1 may be equal to or larger than the upper surface area. The lower width b4 in the first direction from the through hole TH1 may be equal to or greater than the upper width. When the lower width b4 is 250 µm or more, for example, it may be in the range of 250 to 350 µm, and when it is larger than the above range, the rigidity of the body 115 may be reduced and when it is smaller than the above range, the first resin 160 may decrease an injecting efficiency. The lower width in the second direction from the through hole TH1 may be equal to or greater than the upper width. The upper width in the first direction from the through hole TH1 may be smaller than the distance between the first frame 111 and the second frame 113. The upper width in the second direction from the through hole TH1 may be equal to or less than the width of the first and second protrusions 11 and 31. The through hole TH1 and the first and second protrusions 11 and 31 may overlap each other in the first direction. The through hole TH1 may overlap the light emitting device 120 in a vertical direction. The first resin 160 is disposed in the through hole TH1, and may be adhered between the body 115 and the light emitting device 120. For example, the first resin 160 is cured after being injected through the through hole TH1 and the light emitting device 120 may be attached to the body 115. In this case, since the first resin 160 is injected through the through hole TH1 at the bottom of the package, the space for dispensing the resin through the cavity 102 may be removed, and the light emitting device 120 and The interval b1 between the side surfaces of the cavity 102 may be further narrowed.

Figure 9:
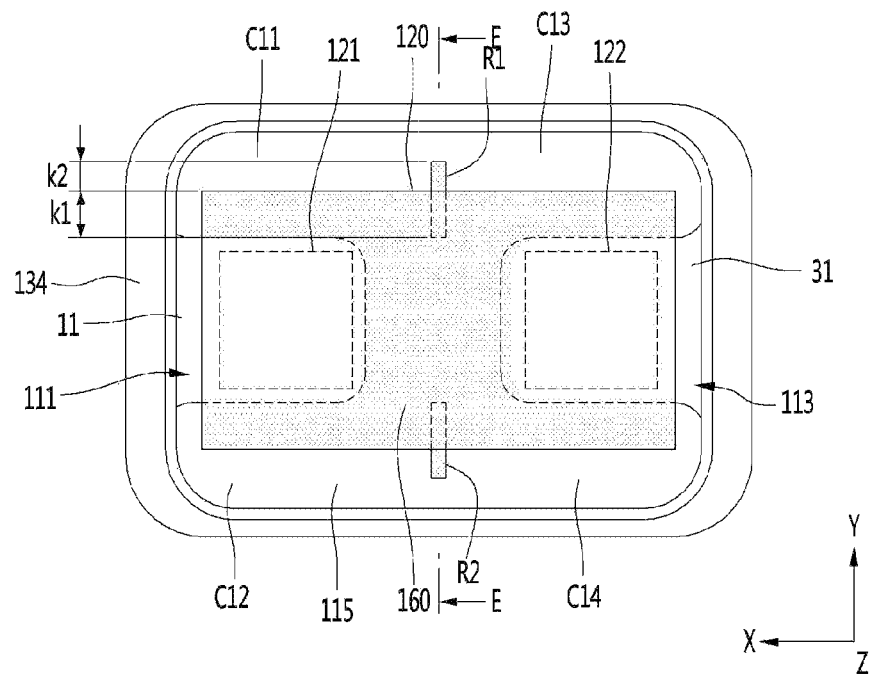
FIG. 9 is a view showing a recess of the body as another example of the light emitting device package of FIG. 7.
Figure 10:
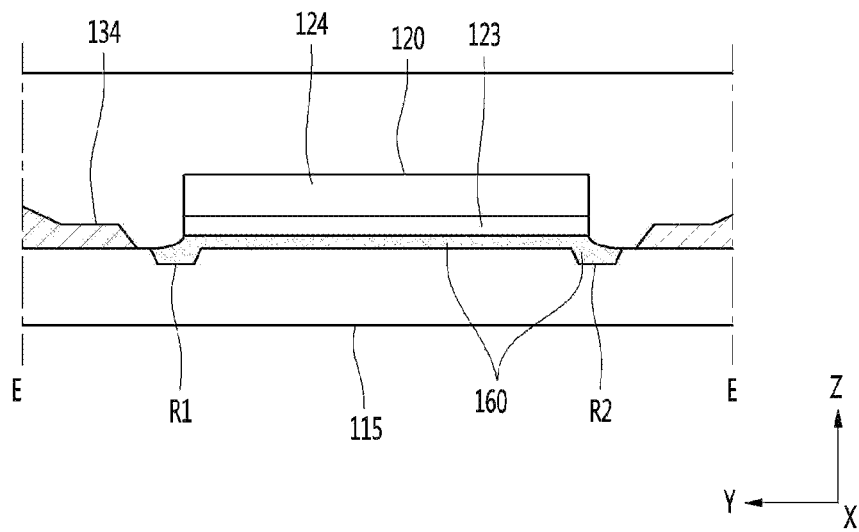
FIG. 10 is a cross-sectional view taken along E-E side sectional view of the light emitting device package of FIG. 9.

FIGS. 9 and 10 are other examples of the light emitting device package according to the first embodiment. FIGS. 9 and 10, the light emitting device package may include one or a plurality of recesses on the bottom or body 115 of the cavity 102. The first and second recesses R1 and R2 may be spaced apart from the upper portion of the body 115 in the second direction, and may be concave in a direction of the lower surface from the upper surface of the body 115. At least part or all of the first and second recesses R1 and R2 may overlap the light emitting device 120 in a vertical direction. The first resin 160 may be disposed and supported in the first and second recesses R1 and R2. The depths of the first and second recesses R1 and R2 may be smaller than the thicknesses of the first and second frames 111 and 113, and may be 300 µm or less, for example, in a range of 15 to 300 µm, and when it is small, the resin holding force may be lowered, and when it is larger than the above range, the rigidity of the body 115 may be lowered or light leakage through the body 115 may be caused. The first and second recesses R1 and R2 may include an inner portion k1 overlapping the light emitting device 120 in a vertical direction, and an outer portion k2 protruding outward from a side surface of the light emitting device 120. The side surfaces of the light emitting device 120 overlapping the first and second recesses R1 and R2 may be both sides or long sides in the second direction. The inner portion k1 of each of the recesses R1 and R2 may be disposed or spaced between the first and second protrusions 11 and 31. The outer portions k2 of the recesses R1 and R2 may not overlap the first and second protrusions 11 and 31 in the first direction. The first recess R1 may be disposed between the first and third reflective portions C11 and C13, and the second recess R2 may be disposed between the second and fourth reflective portions C12 and C14. Each of the recesses R1 and R2 may have a length ratio of the inner portion k1 and the outer portion k2 in a range of 4:6 to 6:4. Since the second resin 160 is disposed in the recesses R1 and R2, the second resin 160 extends on the outer portion k2, thereby reducing light loss. As another example, the body 115 is provided with a recess having a length in the range of 40% to 120% of the length of the light emitting device 120 in the second direction, so as to relieve heat distortion in the first direction and to suppress the crack of the conductive portion. The outer portion k2 of each recess R1, R2 is spaced apart from the reflective wall 134 of the cavity 102, so that the first resin 160 extends to the surface of the reflective wall 134 may be suppressed. The width of the recesses R1 and R2 in the first direction may be smaller than the interval between the first and second protrusions 11 and 31. The lengths of the recesses R1 and R2 in the second direction may be smaller than the lengths of the second direction of the light emitting device 120, thereby enhancing adhesion to the first resin at the bottom of the light emitting device 120. The length of the second direction of the recesses R1 and R2 may be greater than the width of the first direction of the recesses R1 and R2. Each of the recesses R1 and R2 may have a top view shape, a polygonal shape, for example, a triangular shape, a square shape, or a pentagonal shape. As another example, each of the recesses R1 and R2 may have a circular shape or an elliptical shape, and may be provided in a shape capable of guiding the first resin 160. Each of the recesses R1 and R2 may have a side cross-sectional shape of a polygonal shape or a curved shape, for example, a triangular shape or a square shape or a hemispherical shape. The structure of each of the recesses R1 and R2 may be provided in a structure in which the supporting force is not reduced while reducing the influence on the body 115. The recesses R1 and R2 have an upper width disposed wider than a lower width, so that the inside may be provided with an inclined surface. A through hole may be disposed in the body between the first and second recesses R1 and R2. The first and second recesses R1 and R2, the first resin 160 disposed between the body 115 and the light emitting device 120 fix the light emitting device 120 and may improve reflection efficiency.

Figure 11:
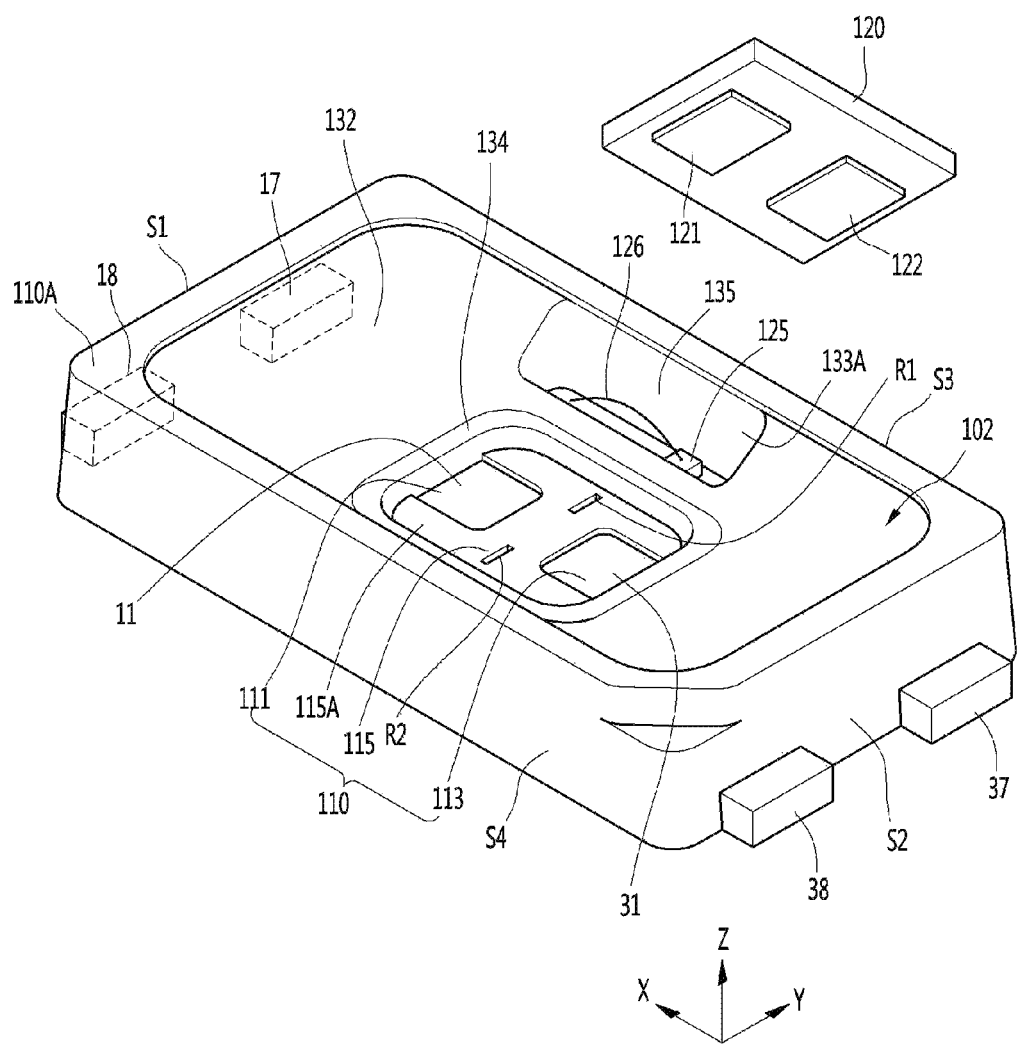
FIG. 11 is a perspective view illustrating a first modification example in the light emitting device package of FIG. 1.
Figure 12:
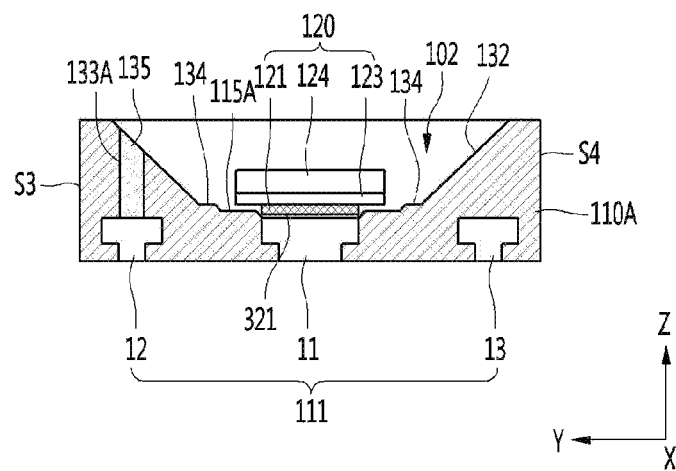
FIG. 12 is a view showing a cross section in a second direction based on the first frame in the light emitting device package of FIG. 11.
Figure 13:
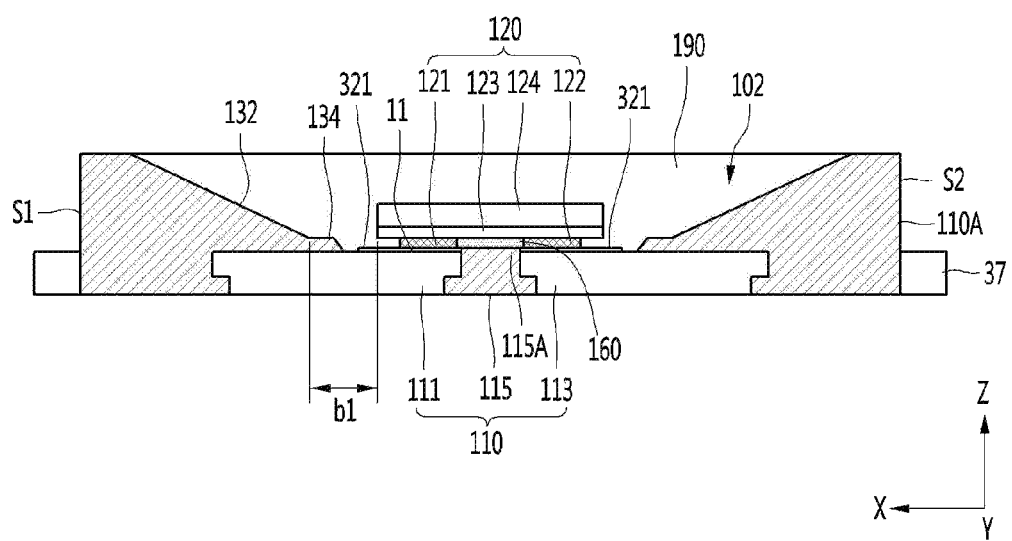
FIG. 13 is a view showing a cross section in a first direction passing through the first and second frames in the light emitting device package of FIG. 11.
Figure 14:
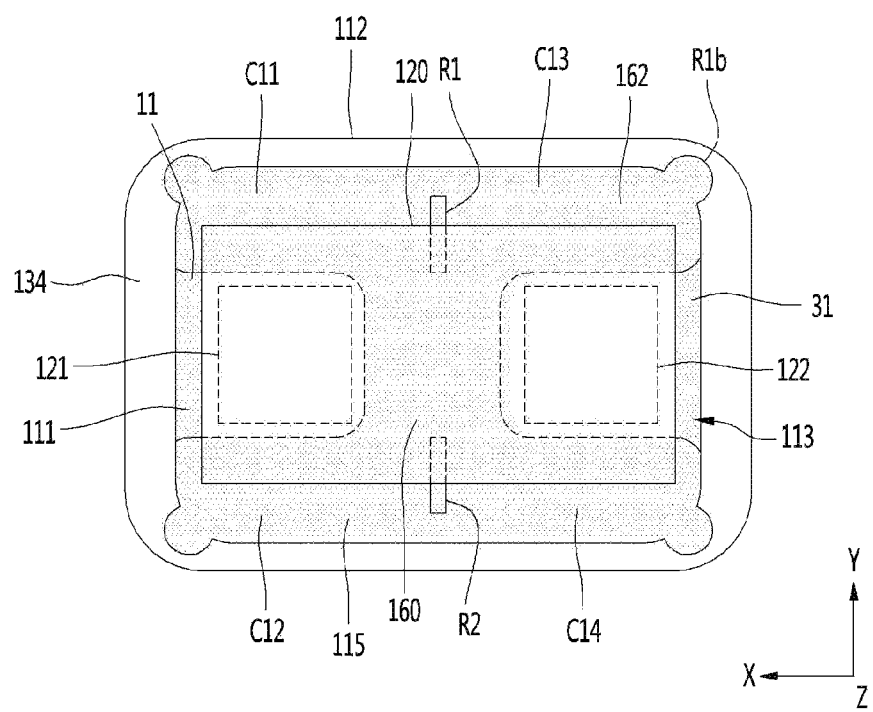
FIG. 14 is an example of a plan view of a body deformed in the light emitting device package of FIG. 11.

FIGS. 11 to 13 are views of a first modification example of the light emitting device package according to the first embodiment. The first modification example may be selectively applied while referring to the configuration and description of the first embodiment disclosed above. Referring to FIGS. 11 to 13, the body 115 may include a support portion 115A protruding from the upper surfaces of the frames 111 and 113. The support portion 115A is disposed on the bottom of the cavity 102 and may protrude in the direction of the light emitting device 120 from the upper surfaces of the frames 111 and 113. The support portion 115A may protrude above the upper surfaces of the first and second protrusions 11 and 31. The support portion 115A may protrude higher the body 115 and the first to fourth reflective portions C11, C12, C13, and C14 than the upper surfaces of the frames 111 and 113. The support portion 115A may function as a dam around the first and second protrusions 11 and 31. For example, the first and second protrusions 11 and 31 may be connected to the reflective wall 134 and function as a dam for the conductive portions on the first and second protrusions 11 and 31. Accordingly, the conductive portions 321 disposed on the first and second protrusions 11 and 31 may be provided in a uniform distribution with a predetermined thickness or more by the support portion 115A. That is, by arranging a resin wall around the conductive portion 321 using the support portion 115A of the body 115, it is possible to secure a uniform thickness of the conductive portion and prevent cracking, so that electricity reliability of the light emitting device may improve.

The upper surface area of the support portion 115A may be larger than the upper surface area of the first and second protrusions 11 and 31 exposed to the bottom of the cavity 102. The support portion 115A may separate the lower surface (excluding the bonding portion) of the light emitting device 120 from the upper surfaces of the first and second frames 111 and 113 or the first and second protrusions 11 and 31. The support portion 115A may be disposed in regions that do not overlap with the first and second bonding portions 121 and 122 of the light emitting device 120 in the vertical direction. Here, by blocking or reducing the pressure applied from the light emitting device 120, diffusion of the conductive portion provided in the liquid phase during the bonding process is suppressed, the thickness of the conductive portion may be secured, and crack generation may be suppressed.

The recesses R1 and R2 may be disposed on the support portion 115A of the body 115. The depth of the recesses R1 and R2 disposed on the support portion 115A may be 300 µm or less, for example, in the range of 15 to 300 µm, when it is small than the above range, a supporting force of the resin may be deteriorated, when it is greater than the above range, the rigidity of the body 115 may be deteriorated and the improvement of the supporting force may be insignificant and may cause light leakage through the body 115.

Figure 15:
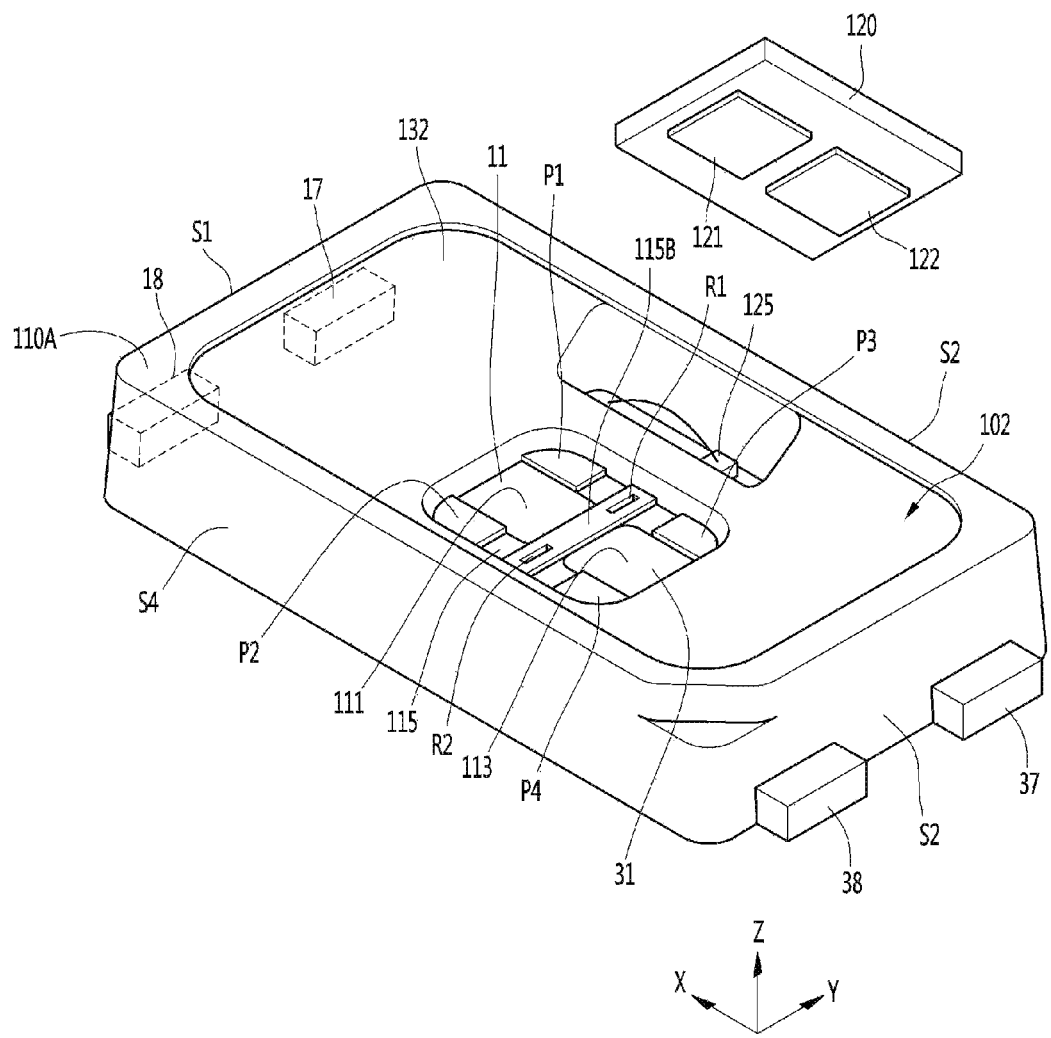
FIG. 15 is a perspective view illustrating a second modification example of the light emitting device package of FIG. 1.

Referring to FIGS. 15 and 11, the light emitting device package may include a concave portion R1$b$ in a corner region of the cavity 102. The concave portion R1$b$ is disposed on a relatively large area in a space between the light emitting device 120 and the inner surface 132 of the cavity 102, or may be a recessed shape outward from a corner portion of the cavity 102. The concave portion R1$b$ may be arranged in one or a plurality, and the concave portion R1$b$ may be disposed in regions corresponding to each of the corner portions of the light emitting device 120. The concave portion R1$b$ may provide a space in which a structure for dispensing the second resin 162 may be easily inserted. The diameter of the concave portion R1$b$ is provided in the range of 300 to 400 µm, and it is possible to enable the insertion of the structure. The second resin 162 may include a filler such as $TiO_2$, $SiO_2$, or $Al_2O_3$ in a transparent resin. When the process of accelerating the precipitation phenomenon for the fillers added to the second resin 162 is performed, the fillers added to the second resin 162 may precipitate in the bottom direction. Here, the process of accelerating the precipitation phenomenon may include a process of accelerating by using a centrifugal separator.

The second resin 162 may be connected to the first resin 160. The second resin 162 may be disposed around the first resin 160. The second resin 162 may be disposed around the bonding portions 121 and 122 of the light emitting device 120 to prevent diffusion of the conductive portion and thus function as a dam of the conductive portion.

Figure 16:
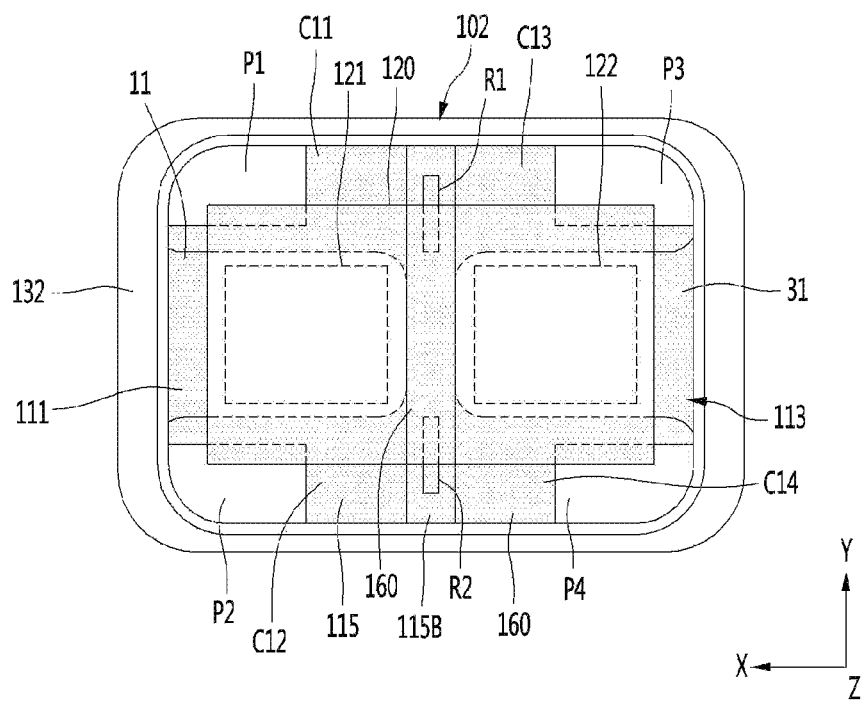
FIG. 16 is a view showing a region of the first resin under the light emitting device in the light emitting device package of FIG. 15.

Referring to FIGS. 15 and 16, the support portion 115B of the body 115 is disposed between the first protrusion 11 of the first frame 111 and the second protrusion 31 of the second frame 113. One or a plurality of recesses R1 and R2 may be disposed in the support portion 115B. The support portion 115B has a long length in the second direction and may overlap the light emitting device 120 in the vertical direction. The length of the support portion 115B may have a length longer than the length of the second direction of the light emitting device 120. The width in the first direction of the support portion 115B may be equal to or smaller than the interval between the first and second protrusions 11 and 31. The support portion 115B may protrude in the direction of the light emitting device 120 than the upper surfaces of the first and second frames 111 and 113 or the upper surfaces of the first and second protrusions 11 and 31. The support portion 115B may be disposed between the first and second bonding portions 121 and 122 of the light emitting device 120. The support portion 115B may support a lower surface disposed between the first and second bonding portions 121 and 122. The thickness of the support portion 115B may be formed in a range of 40 µm or less, for example, in a range of 30 to 40 µm, from the upper surfaces of the first and second frames 111 and 113. The support portion 115B may function as a dam of the conductive portion 321 between the first and second protrusions 11 and 31. A first resin 160 is adhered between the support portion 115B and the light emitting device 120 to prevent the light emitting device 120 from being tilted or flowed.

The body 115 may include spacers P1, P2, P3, and P4. The spacers P1, P2, P3, and P4 may separate the light emitting device 120 from the upper surfaces of the frames 111 and 113. The plurality of spacers P1, P2, P3, and P4 may separate the first and second bonding portions 121 and 122 of the light emitting device 120 from the upper surfaces of the first and second frames 111 and 113. The upper surfaces of the spacers P1, P2, P3, and P4 may protrude higher than the lower surfaces of the first and second bonding portions 121 and 122. The spacers P1, P2, P3, and P4 may be disposed on an edge of the lower surface of the light emitting device 120 or may overlap the edge of the lower surface of the light emitting device 1200 in the vertical direction. The spacers P1, P2, P3, and P4 may be the same material as the body 115. The spacers P1, P2, P3, and P4 are other examples of the material constituting the frame 111 and 113 or the same material as the frame 111 and 113. The number of spacers P1, P2, P3, and P4 may be 3 or more, or 4 or more. The spacers P1, P2, P3, and P4 may provide an interval between the light emitting device 120 and the upper surfaces of the frames 111 and 113, and may prevent the light emitting device 120 from being tilted in the manufacturing process. The spacers P1, P2, P3, and P4 include the first and second protrusions 11 and 31, the thickness of the conductive portion 321 may be prevented from falling, and the light emitting device 120 is spaced apart from the upper surface of the frame to provide a space to facilitate the under-fill process.

The spacers P1, P2, P3, and P4 include first and second spacers P1 and P2 disposed on both sides of the first protrusion 11 of the first frame 111 in the second direction, and third and fourth spacers P3 and P4 disposed on both sides of the second protrusion 31 of the second frame 113 in the second direction. The first and second spacers P1 and P2 extend in the first lateral direction on the first and second reflective portions C11 and C12 and may overlap the upper surfaces of the first frame 111 or the first protrusion 11 in the vertical direction. An area of the first and second spacers P1 and P2 that overlaps the first and second reflecting parts C11 and C12 has greater than an area overlapping the first frame 111 or the first protrusion 11, thereby reinforcing the support force. The third and fourth spacers P3 and P4 extend in the second side direction on the third reflective portion C13 and may be overlapped with the upper surface of the second frame 113 or the second protrusion 31 in the vertical direction. An area of the third and fourth spacers P3 and P4 that overlaps the third and fourth reflecting parts C13 and C14 has greater than the area overlapping the second frame 113 or the second protrusion 31, thereby reinforcing the support force. The interval between the first and second spacers P1 and P2 and the interval between the third and fourth spacers P3 and P4 are equal to or smaller than the lengths of the first and second protrusions 11 and 31 in the second direction, and may be support the lower surface of the light emitting device 120. The interval between the first and third spacers P1 and P3 and the interval between the second and fourth spacers P2 and P4 may be smaller than the length in the first direction of the light emitting device 120, and may be supported the lower surface of light emitting device 120. The first to fourth spacers P1, P2, P3, and P4 may be disposed under each corner of the light emitting device 120 and correspond to corners of the first and second bonding portions 121 and 122. The spacers P1, P2, P3, and P4 are formed of the same material as the body 115, may be suppressed the spreadability of the conductive portion 321, and may be spaced the light emitting device 120 from the upper surfaces of first and second frame 111 and 113 in a predetermined distance. The thickness of the spacers P1, P2, P3, and P4 is a vertical distance from the upper surfaces of the first and second frames 111 and 113, and may be 35 μm or more, for example, in a range of 35 to 65 μm or 40 to 50 μm. When the thickness of the pacers P1, P2, P3, and P4 is smaller than the above range, it is difficult to secure the thickness of the conductive portion 321, so that cracks are generated in the conductive portion 321, or electrical or thermal conductivity characteristics are deteriorated. When it is larger than the above range, the dispensing amount of the conductive portion 321 is increased, which may cause a problem of penetration into other regions. The spacers P1, P2, P3, and P4 may have the same thickness. Each of the spacers P1, P2, P3, and P4 may include a circular shape, a polygonal shape, an elliptical shape, or a polygonal shape with rounded corners. The first to fourth spacers P1, P2, P3, and P4 may be connected to the reflective wall 134 of the inner surface 132 of the cavity 102.

The first to fourth spacers P1, P2, P3, and P4 may protrude above the bottom of the cavity 102. The first to fourth spacers P1, P2, P3, and P4 may be disposed higher than the upper surface of the body 115 or the lower surfaces of the first and second bonding portions 121 and 122. The area of the polygon connecting the inner surfaces of the plurality of spacers P1, P2, P3, and P4 in the first direction and the second direction to each other is smaller than the area of the lower surface of the light emitting device, or may be greater than a sum of the areas of bonding portions of the light emitting device. Alternatively, the area of the polygonal line connecting the straight lines passing in the first direction and the second direction with respect to the outer lines of the plurality of spacers P1, P2, P3, and P4 may be larger than the lower surface area of the light emitting device. The first and third spacers P1 and P3 may be disposed on both sides based on the support portion 115B. The second and fourth spacers P2 and P4 may be disposed on both sides based on the support portion 115B. The support portion 115B may be disposed between the first and second bonding portions 121 and 122 of the light emitting device 120. The thickness of the first to fourth spacers P1, P2, P3, and P4 may be provided thicker than the thickness of the support portion 115B. The thickness of the support portion 115B may be disposed lower than 10 μm, for example, in a range of 10 to 20 μm, based on the thickness of the spacers P1, P2, P3, and P4. Accordingly, the first resin 160 may be adhered with a predetermined thickness between the upper surface of the support portion 115B and the lower surface of the light emitting device 120.

Figure 17:
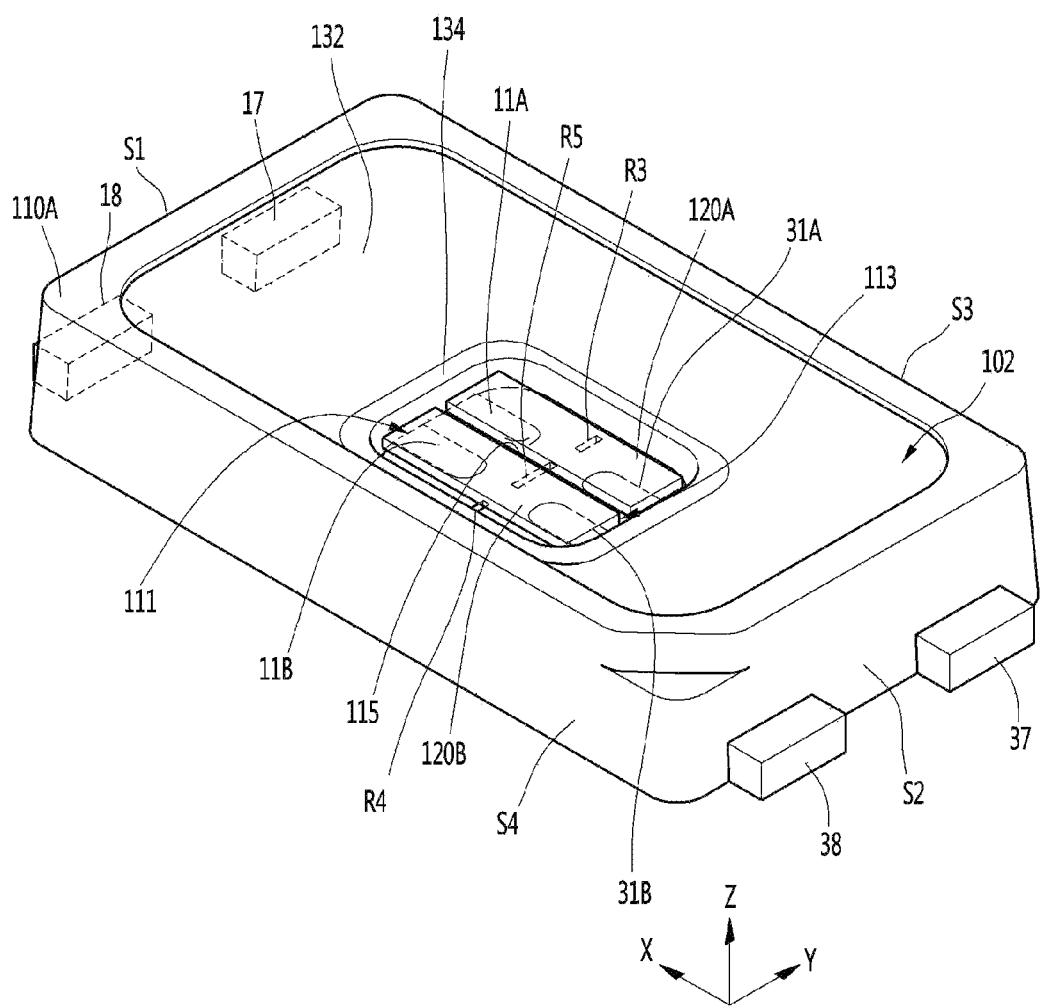
FIG. 17 is a perspective view showing a third modification example of the light emitting device package according to the embodiment(s) of the present invention.
Figure 18:
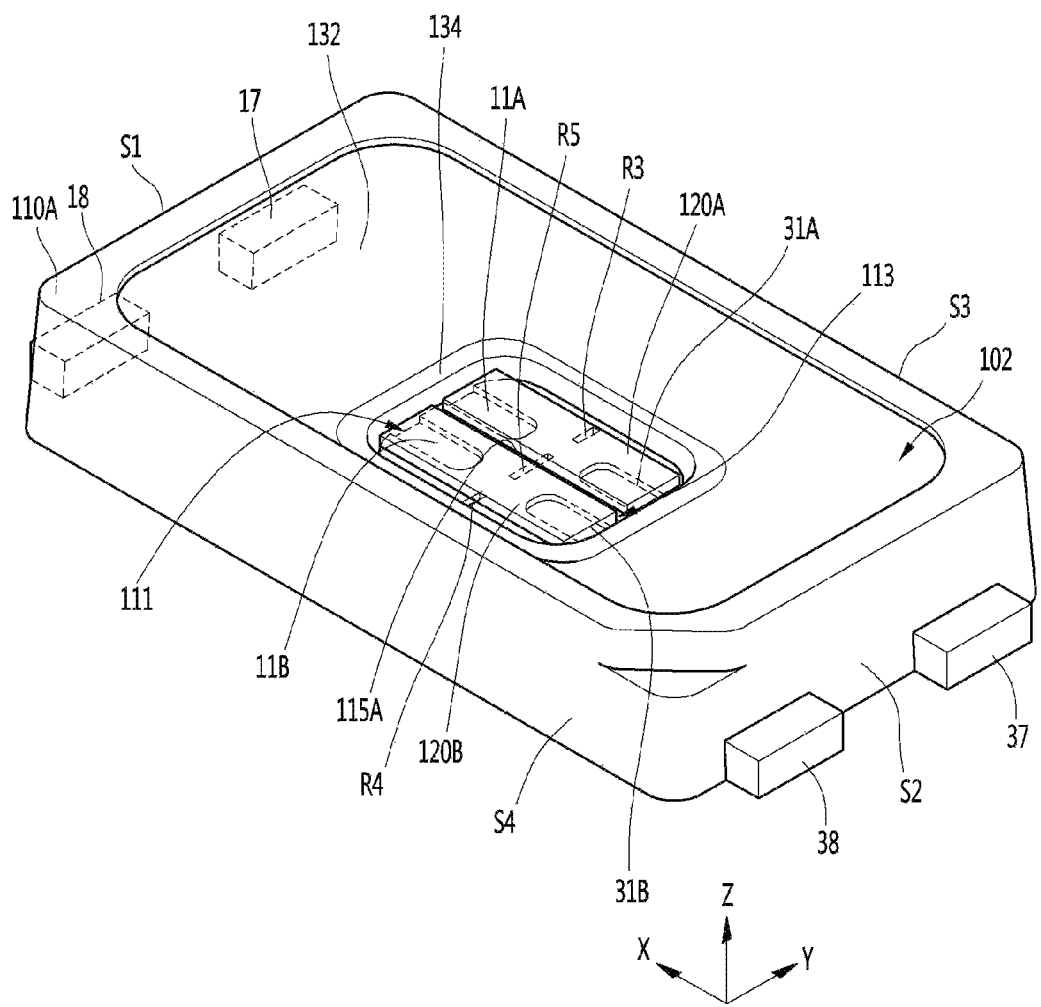
FIG. 18 is a perspective view showing a fourth modification of the light emitting device package according to the embodiment(s) of the present invention.

FIGS. 17 to 19 are views showing third and fourth modified examples of the light emitting device package.

Referring to FIGS. 17 and 19, the first frame 111 may have a plurality of first protrusions 11A and 11B, and the second frame 113 may have a plurality of second protrusions 31A and 31B. The first frame 111 may have third and fourth protrusions, and the second frame 113 may have fifth and sixth protrusions. The first frame 111 may have a concave groove C10 between the protrusions, and the second frame 113 may have a concave groove C30 between the protrusions. First and second light emitting devices 120A and 120B may be disposed on the plurality of first protrusions 11A and 11B and the plurality of second protrusions 31A and 31B. A reflective portion of the body 115 may be disposed between the plurality of first protrusions 11A and 11B and the plurality of second protrusions 31A and 31B. A plurality of recesses R3, R4, and R5 may be disposed on the body 115. The plurality of recesses R3, R4, and R5 may include first and third recesses R3 and R5 disposed under the first light emitting device 120A, and second and third recesses R4 and R5 disposed under the second light emitting device 120B. The third recesses R5 may be disposed under the first and second light emitting devices 120A and 120B, respectively. The first to third recesses R3, R4, and R5 are spaced apart from each other in the second direction and may be disposed on the same straight line. The length of the third recess R5 in the second direction may be longer than an interval between the first and second light emitting devices 120A and 120B. The first and third recesses R3 and R5 may include an inner portion that partially overlaps the first light emitting device 120A and an outer portion that does not overlap. The second and third recesses R4 and R5 may include an inner portion overlapping a portion of the second light emitting device 120B and an outer portion not overlapping. A first resin 160 (see FIG. 4) may be disposed between the body 115 and the plurality of light emitting devices 120A and 120B, and the first resin 160 may be attached the plurality of light emitting devices 120A and 120B to the body 115, and may be disposed on the first to third recesses R3, R4, and R5.

Referring to FIGS. 18 and 19, the light emitting device package will refer to the configuration of the body 115 as shown in FIG. 11. The body 115 may include a support region protruding from the upper surfaces of the frames 111 and 113. The support region may include at least one of the support portion 115A as shown in FIG. 11 or the support portion 115B and spacers P1, P2, P3, and P4 as shown in FIG. 15. Since the support portions 115A and 115B or spacers are disposed on the body 115, the light emitting devices 120A and 120B may be spaced apart from, for example, upper surfaces of the frames 111 and 113, for example, an upper surfaces of the first protrusions 11A and 11B and the second protrusions 31A and 31B. Here, as shown in FIG. 17, the first protrusions 11A and 11B are disposed in plural in the first frame 111, and the second protrusions 31A and 31B may be disposed in plural in the second frame 113. Light emitting devices 120A and 120B may be disposed on the plurality of first protrusions 11A and 11B and the plurality of second protrusions 31A and 31B, respectively.

Second Embodiment

FIGS. 20 to 26 are views of a light emitting device package according to a second embodiment of the invention. The description of the second embodiment refers to the description and configuration of the first embodiment disclosed above, and may be selectively applied. Referring to FIGS. 20 to 26, the upper surface of the support portion 115B of the body 115 may be provided as a flat surface, and may be provided at a width equal to or smaller than the bottom width Wa. As another example, the upper surface of the support portion 115B may include at least one of a convex curved surface, a convex curved surface or an inclined surface. Each of the third and fourth side surfaces S3 and S4 of the body 115 or the package body 110 may include a plurality of step structures ST5. The step structure ST5 may be a locking jaw for a finger when the package body 110 is injected. The step structure ST5 may be disposed to be concave in an inner direction than the third and fourth side surfaces S3 and S4.

The first frame 111 may include a first conductive protrusion F1 and the second frame 113 may include a second conductive protrusion F2. The first and second conductive protrusions F1 and F2 may be spaced apart from the bottom of the cavity 102 in a first direction, located under a region of the light emitting device 120 and may overlapped with the light emitting device 120 in the vertical direction. The first conductive protrusion F1 may be formed of the first frame 111 and may protrude in a direction of the light emitting device 120 higher than the upper surface of the first frame 111. The second conductive protrusion F2 may be formed of the second frame 113 and may protrude in the direction of the light emitting device 120 higher than the upper surface of the second frame 113. The first and second conductive protrusions F1 and F2 may protrude in the vertical direction Z on the upper and lower surfaces of the first and second frames 111 and 113. The first frame 111 includes a first concave portion F10 under the first conductive protrusion F1, and the second frame 113 may include a second concave portion F20 under the second conductive protrusion F2. The first and second concave portions F10 and F20 may overlap the first and second conductive protrusions F1 and F2 in the vertical direction. The first and second recesses F10 and F20 are concave in a direction from the lower surface of each frame 111 and 113 toward the upper surface, and may be formed in a cup shape or a recess structure. The heights Pb of the first and second conductive protrusions F1 and F2 may be equal to the depth e of the first and second concave portions F10 and F20. The height Pb may be in the range of 50 µm or less, for example, 25 to 50 µm, based on the flat upper surfaces of the first and/or second frames 111 and 113, and when it is smaller than the range, a thickness of the second resin 162 may be thinner, thereby reducing the light reflection efficiency, and when it is larger than the above range, the size of the conductive protrusions F1 and F2 may be increased. Here, the height Pa of the support portion 115B may be referred to as a first height, and the height Pb of the conductive protrusions F1 and F2 may be referred to as a second height, and the first height may be different from the second height. Alternatively, the first height may be greater than the second height.

Figure 24:
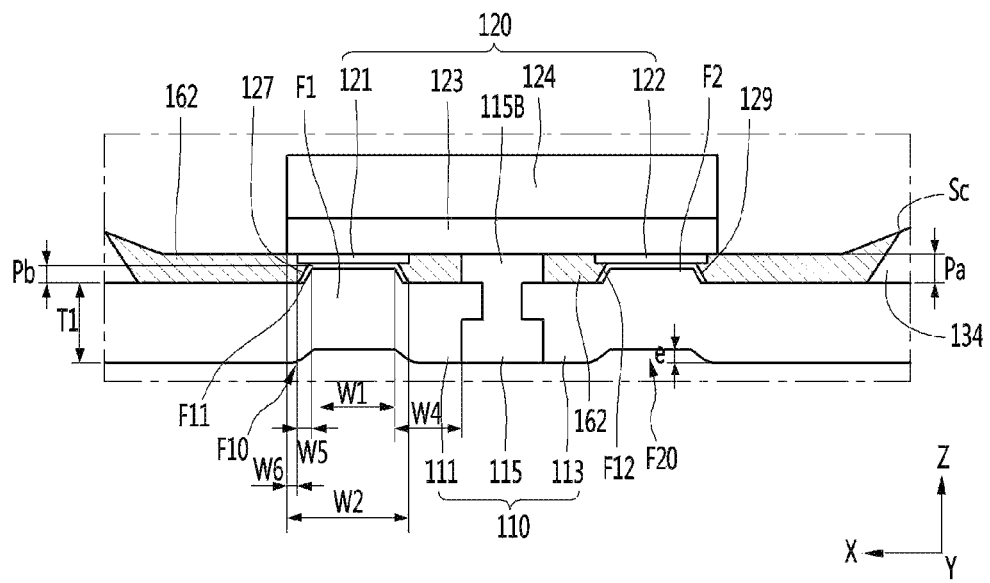
FIG. 24 is an enlarged view illustrating a conductive protrusion of the frame of the light emitting device package and a bonding portion of the light emitting device in FIG. 21.
Figure 26:
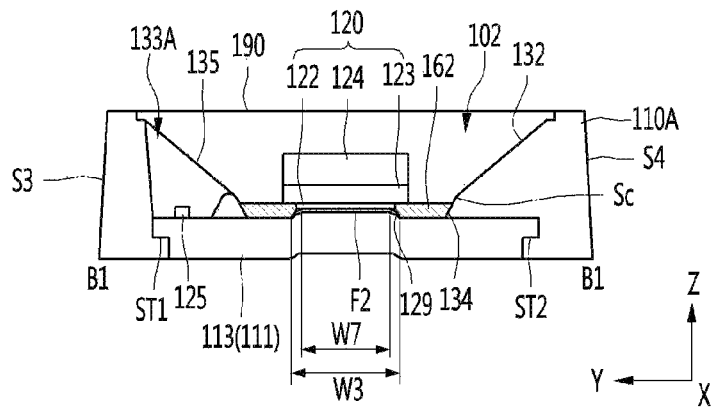
FIG. 26 is a cross-sectional view taken along B1-B1 side of the light emitting device package of FIG. 21.

As shown in FIGS. 24 and 26, the upper surfaces of the first and second conductive protrusions F1 and F2 have a length W7 (W7>W1) in the second direction Y greater than a width W1 in the first direction X. The first direction may be a direction in which an imaginary line connecting the centers of the first and second conductive protrusions F1 and F2 extends. The first and second conductive protrusions F1 and F2 face the first and second bonding portions 121 and 122 of the light emitting device 120 and may overlap in the vertical direction. The vertical direction may be a direction from the upper surface of the first and second frames 111 and 113 toward the lower surface or toward the light emitting device.

The support portion 115B of the body 115 is disposed between the first and second conductive protrusions F1 and F2, and may have a length longer than the length of the first and second conductive protrusions F1 and F2 in the second direction. The thickness Pa of the support portion 115B may be disposed greater than the thickness Pb of the first and second conductive protrusions F1 and F2 based on the upper surfaces of the first and second frames 111 and 113. The thickness Pa of the support portion 115B may be formed in a range of 50 µm or more, for example, 50 to 80 µm, from the upper surfaces of the first and second frames 111 and 113, and when the thickness Pa is smaller than the range, the difference of heights between the conductive protrusions F1 and F2 and the support portion 115B is small, so it is difficult to secure the thickness of the conductive portions 127 and 129, and when it is larger than the above range, the light emitting device 120 may be tilted. The upper surface of the support portion 115B may be disposed higher than the lower surfaces of the first and second bonding portions 121 and 122 of the light emitting device 120. Accordingly, since the support portion 115B supports the lower portion of the center region of the light emitting device 120, the first and second bonding portions 121 and 122 of the light emitting device 120 may be spaced apart from the upper surfaces of the first and second conductive protrusions F1 and F2. The height difference Pc-Pb between the support portion 115B and the conductive protrusions F1 and F2 may be 20 µm or more, for example, in a range of 20 to 50 µm. The height difference Pc-Pb between the support portion 115B and the conductive protrusions F1 and F2 may be equal to the thickness of the conductive portions 127 and 129.

The upper surfaces of the first and second frames 111 and 113 may be disposed on the same plane with each other. Upper surfaces of the first and second conductive protrusions F1 and F2 have first and second flat surfaces, and widths of the first and second flat surfaces may be different the widths of the first and second bonding portions 121 and 122. For example, the widths of the flat lower surfaces of the first and second bonding portions 12 and 122 may be larger than the widths of the first and second flat surfaces. Here, an interval between each bonding portion 121 and 122 of the light emitting device 120 and each of the conductive protrusions F1 and F2 may secure the thickness of the conductive portion disposed between the bonding portions 121 and 122 and the conductive protrusions F1 and F2 above a certain thickness. Accordingly, it is possible to prevent a cracking problem due to the uneven thickness of the conductive portions 127 and 129 and a decrease in electrical and thermal conductivity. Here, when there is no the support portion 115B, the conductive portions 127 and 129 have increased spreadability and have a thinner thickness or a non-uniform distribution, and the electrical conduction characteristics and heat conduction characteristics on a space between the bonding portions 121 and 122 and the conductive protrusions F1 and F2 may be reduced.

The conductive portions 127 and 129 may include a first conductive portion 127 between the first bonding portion 121 and the first conductive protrusion F1, and a second conductive portion 129 between the second bonding portion 122 and the second conductive protrusion F2. The first conductive portion 127 may be disposed and bonded between the first conductive protrusion F1 of the first frame 111 and the first bonding portion 121 of the light emitting device 120. The second conductive portion 129 may be disposed and bonded between the second conductive protrusion F2 of the second frame 113 and the second bonding portion 122 of the light emitting device 120. The first and second conductive portions 127 and 129 may be connected between the first frame 111 and the first bonding portion 121 and between the second frame 113 and the second bonding portion 122. A portion of the first and second conductive portions 127 and 129 may be disposed around the first and second conductive protrusions F1 and F2. The conductive portions 127 and 129 will be referred to the description of the conductive portion material, the intermetallic compound layer, and the alloy layer disclosed in the first embodiment.

Referring to FIG. 24, the height Pb of the conductive protrusions F1 and F2 in each frame 111 and 112 may be smaller than the thickness T1 of the frames 111 and 112. The height Pb may be 10% or more, for example, in a range of 10% to 50% of the thickness T1, and when it is smaller than the above range, the conductive portion extends to the side surface of the light emitting device 120, thereby occurring in short problems or light loss, and when it exceeds the above range, the rigidity of the frames 111 and 112 may be reduced. The thicknesses T1 of the frames 111 and 112 may be 100 μm or more, for example, in a range of 100 to 300 μm, or 200 to 270 μm. When the height Pb of the conductive protrusions F1 and F2 is smaller than the above range, the thickness of the second resin 162 becomes thinner than 50 micrometers, and there is a problem that it cannot function as a reflective resin. Accordingly, the height Pb of the conductive protrusions F1 and F2 may secure the thickness of the second resin 162, thereby preventing a decrease in light reflection efficiency. Here, the outer surfaces F11 and F12 of the first and second conductive protrusions F1 and F2 may be inclined surfaces or surfaces having curved surfaces. The entire area of the upper surface of each of the first and second conductive protrusions F1 and F2 may be equal to or smaller than the lower surface areas of the first and second bonding portions 121 and 122. Here, the area of the upper surface of the first and second conductive protrusions F1 and F2 may be larger than the sum of the areas of the outer surfaces F11 and F12, thereby improving the contact efficiency of the bonding portion.

As shown in FIG. 24, the width W1 in the upper regions of the first and second conductive protrusions F1 and F2 in the first direction X may be less than or equal to the width W2 of the first and second bonding portions 121. The width W2 of the first and second bonding portions 121 and 122 is 20% or more compared to the width of the first direction of the light emitting device 120 and may be, for example, in a range of 20% to 40%. The width W1 may be 50% or more, for example, in a range of 50% to 90% of the width W2 of the bonding portions 121 and 122, and thermal conductivity and electrical conductivity may be improved in the range. As shown in FIG. 26, the length W7 of the upper regions of the first and second conductive protrusions F1 and F2 in the second direction Y may be smaller than the length W3 of the first and second bonding portions 121 and 122. The length W3 of the first and second bonding portions 121 and 122 may be 70% or more, for example, in a range of 70% to 95%, compared to the length of the first light emitting device 120 in the second direction. The width W1 may be 200 μm or more, for example, in a range of 200 to 300 μm. On the first and second frames 111 and 113, a supporting force (e.g., DST: die shear test strength) of the bonding portions 121 and 122 that are firmly attached by the conductive portions 127 and 129 may be increased. The distance W5 from the edge of the upper region of the first and second conductive protrusions F1 and F2 to the ends of the first and second bonding portions 121 and 122 may be provided in a range of 40 μm to 60 μm, thereby improving process or reliability by the conductive portion.

The distance W6 between the first and second bonding portions 121 and 122 and the side surface of the light emitting device 120 may be disposed in a range of 60 μm or more, for example, 60 to 90 μm. When the distance W6 is not secured, it is difficult to secure the distance from the conductive portions 127 and 129, and a problem due to the conductive paste may occur. That is, when the distance W5+W6 between the flat surfaces of the first and second bonding portions 121 and 122 and the side surface of the light emitting device 120 may be spaced in a range of at least 100 μm, a safe distance by the conductive portions 127 and 129 around the conductive protrusions F1 and F2 may be secured.

The width W1 and the length W7 of the upper regions of the first and second conductive protrusions F1 and F2 may be smaller than the width and length of the lower region. Accordingly, it is possible to prevent a problem that a strength of a portion protruding from the frame decreases or a thickness of an inclined side portion becomes thin. The first and second conductive protrusions F1 and F2 may have a polygonal shape, an elliptical shape, or a circular shape. Side cross-sectional shapes of the first and second conductive protrusions F1 and F2 may be polygonal, hemispherical, or semi-elliptical. The side surfaces F11 and F12 may have slopes having different slopes, or may be arranged as curved surfaces having different curvatures. The distance between the first conductive protrusion F1 and the second conductive protrusion F2 on the lower surface regions of the first frame 111 and the second frame 112 may be provided in 100 μm or more, for example, in a range of 100 to 150 μm, thereby preventing the occurrence of an electrical short on the main substrate.

Figure 25:
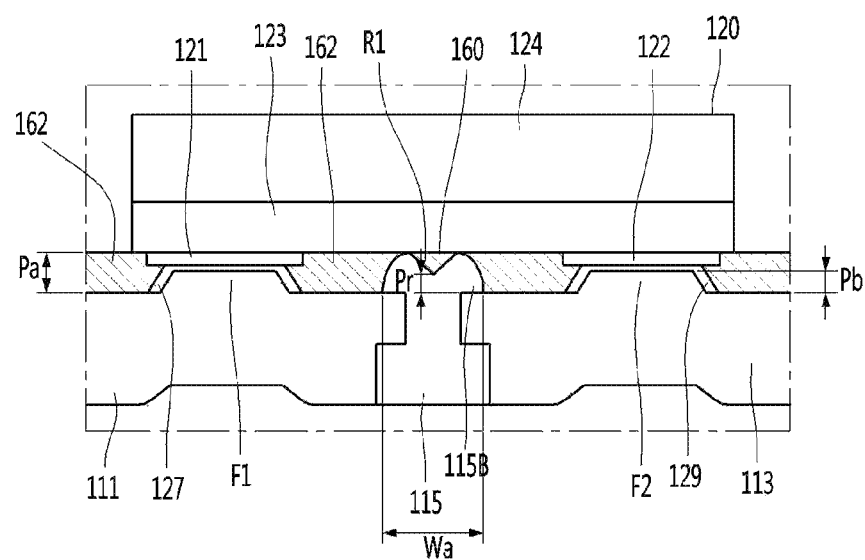
FIG. 25 is a side cross-sectional view showing a recess in the support portion of the body of the light emitting device package in FIG. 21.

As shown in FIGS. 24 and 25, when the conductive protrusions F1 and F2 are disposed adjacent to the body 113 disposed between the first and second frames 111 and 113, a phenomenon in which the frames 111 and 112 are curled or wound in the body side direction may occur by the conductive protrusions F1 and F2. The phenomenon that the end portion of the frame is wound may deteriorate reliability in the process of the package. Accordingly, the distance W4 between the edges of the conductive protrusions F1 and F2 and the body 113 may be 120 μm or more, for example, in the range of 120 to 300 μm, or in the range of 200 to 270 μm.

The ratio (W4:T1) of the distance W4 and the thickness T1 of the frames 111 and 112 may be in the range of 0.8:1 to 1:0.8, for example, the distance W4 and the thickness T1 may be a ratio of 1:1. The width W1 of the upper region of the conductive protrusions F1 and F2 or the distance W4 between the conductive protrusions F1 and F2 and the body based on the thickness T1 of the frames 111 and 112 may be in a range of 80% to 120%. For example, when the width W1 of the upper region of the conductive protrusions F1 and F2, the distance W4 from the body 113, and the thickness T1 of the frames 111 and 112, W1:W4:T1 may include 1:1:1. In the embodiment, when forming the conductive protrusions F1 and F2 on the frames 111 and 112, the frames 111 and 112 may be prevented from curled or wound problem by the conductive protrusions F1 and F2, and the flat areas of the bonding portions 121 and 122 and the conductive protrusions F1 and F2 may be provided in a range in which thermal conductivity and electrical conductivity are not deteriorated. In addition, a conductive protrusion may be provided on the upper portions of the frames 111 and 112 by a mold without a separate half etching process. Referring to FIG. 25, a distance Pr from the bottom of the support portion 115B of the body 115 to the recesses R1 and R2 may be spaced in a range of 15 µm or more, for example, in a range of 15 to 40 µm. Due to the separation distance Pr, the rigidity of the support portion 115B may be prevented from being reduced in the region where the recesses R1 and R2 are formed in the support portion 115B. The support portion 115B may be connected to the reflective wall 134 of the cavity 102, thereby preventing external rigidity from deteriorating. That is, the length of the upper surface in the second direction of the support portion 115B may be greater than the length of the second direction of the bottom of the cavity 102.

The first and second recesses R1 and R2 and the first resin 160 disposed on the body 115 or the support portion 115B will be referred to the description of the embodiment disclosed above. The first resin 160 may be disposed between the first conductive protrusion F1 and the second conductive protrusion F2. For example, the first resin 160 contacts the side surface of the first bonding portion 121 and the side surface of the second bonding portion 122 and may correspond to or contact with an inside of the first conductive protrusion F1 and the second conductive protrusion F2. The thickness of the first resin 160 may be greater than the height Pb or thickness of the conductive protrusions F1 and F2, thereby being in contact with the light emitting device 120. The second resin 162 may be formed by a process disposing the light emitting device 120 and then dispensing it. The second resin 162 may contact a region between the first and second frames 111 and 113 and a lower portion of the light emitting device 120, side surfaces of the first bonding portion 121 and the second bonding portion 122, and the lower surface of the light emitting device 120. The thickness of the second resin 162 may be greater than the height Pb or thickness of the conductive protrusions F1 and F2, thereby being in contact with the light emitting device 120. The second resin 162 may surround or contact the outside of the conductive protrusions F1 and F2. The first resin 160 and the second resin 162 may contact the outside of the conductive portions 127 and 129 disposed on the side surfaces F11 and F12 of the conductive protrusions F1 and F2. Accordingly, even if the conductive portions 127 and 129 are re-melted, the second resin 162 may prevent the material of the conductive portions 127 and 129 from flowing to other regions. The second resin 162 may ride on the reflective wall 134 of the cavity 102 and may be disposed higher than the upper surface of the other region.

Figure 21:
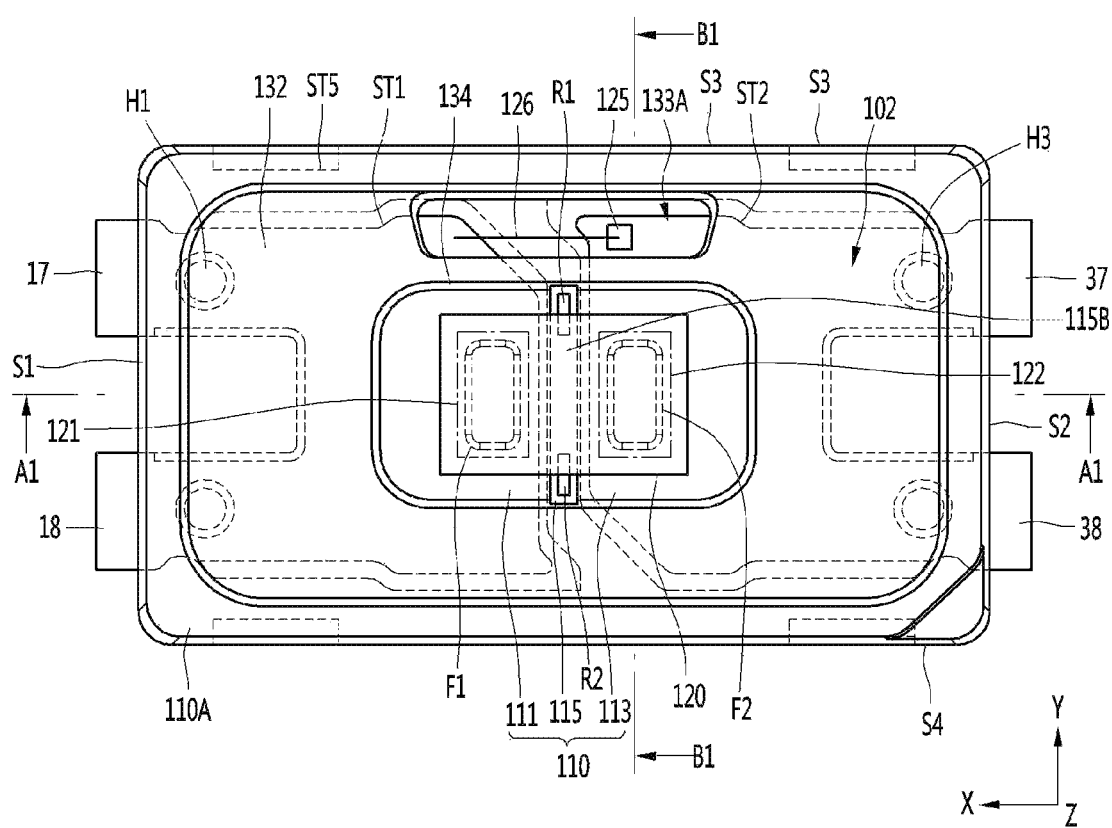
FIG. 21 is a combined plan view of the light emitting device package of FIG. 20.
Figure 22:
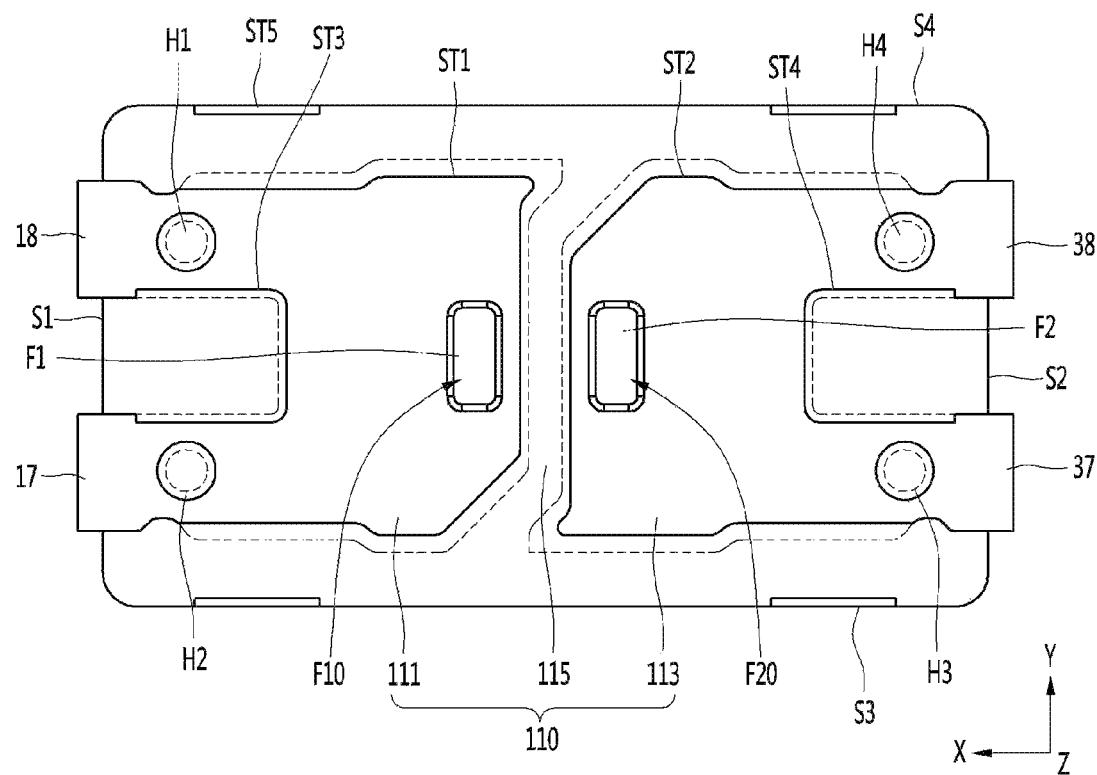
FIG. 22 is a bottom view of the light emitting device package of FIG. 21.
Figure 23:
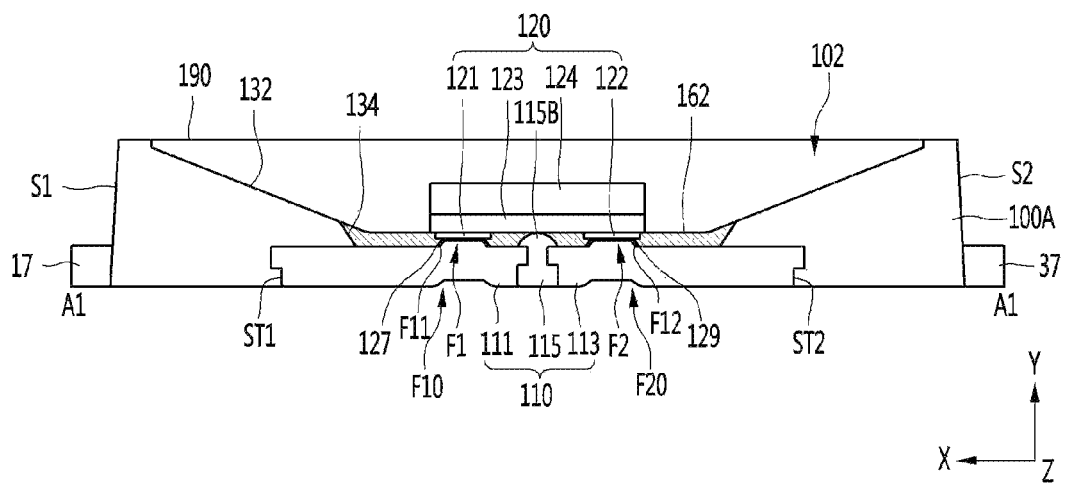
FIG. 23 is a cross-sectional view taken along A1-Al side of the light emitting device package in FIG. 21.
Figure 27:
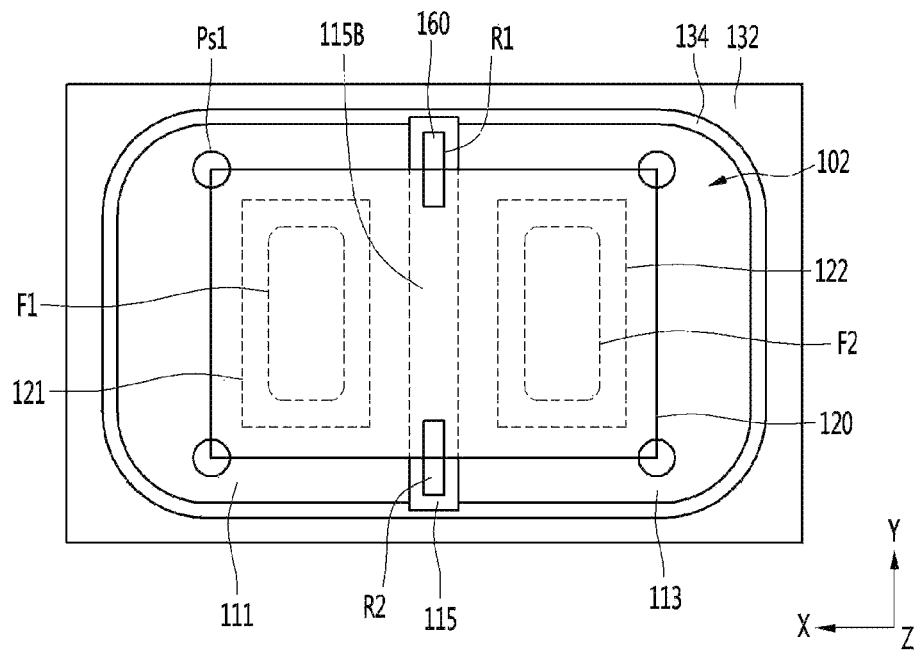
FIG. 27 is a view showing another example of the light emitting device package of FIG. 21.
Figure 28:
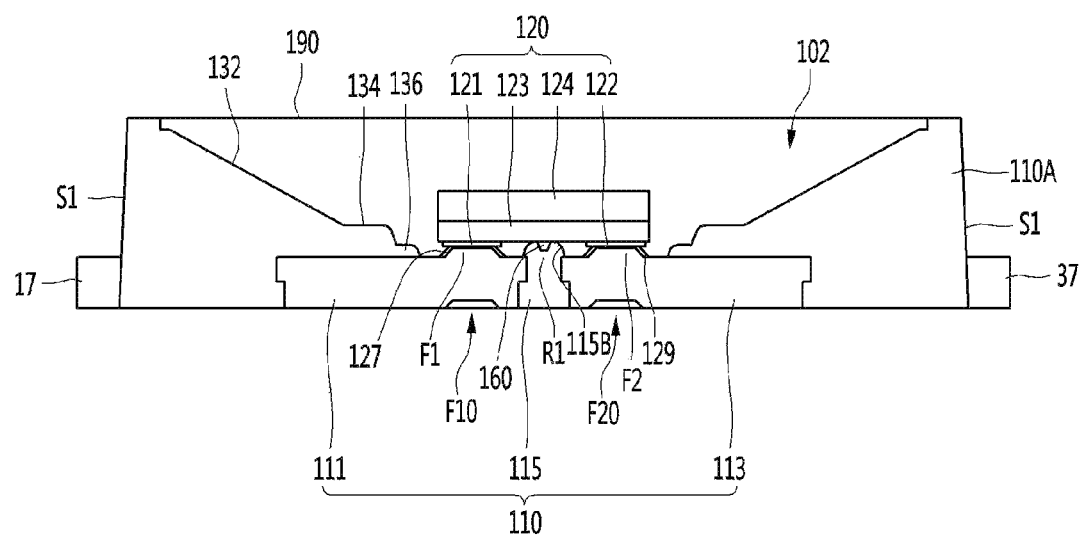
FIG. 28 is a plan view illustrating another example of the light emitting device package of FIG. 21.

FIG. 27 is another example of FIG. 21, and the same parts as those described above will be referred to the above description. Referring to FIG. 27, a support portion 115B of the body, a plurality of conductive protrusions F1 and F2 and a plurality of spacers Ps1 may be disposed on the bottom of the cavity 102. The spacer Ps1 may separate the light emitting device 120 from the upper surfaces of the frames 111 and 113. The plurality of spacers Ps1 will refer to the configuration of the spacer disclosed in FIG. 15. The spacer Ps1 may be disposed at the same height as the support portion 115B, or may be disposed at a lower height, and space the outer portion of the light emitting device 120 from the upper surfaces of the frames 111 and 113. The spacer Ps1 is disposed outside the first and second conductive protrusions F1 and F2 to block pressure from the light emitting device 120 to prevent diffusion of the liquid conductive portion.

Figure 29:
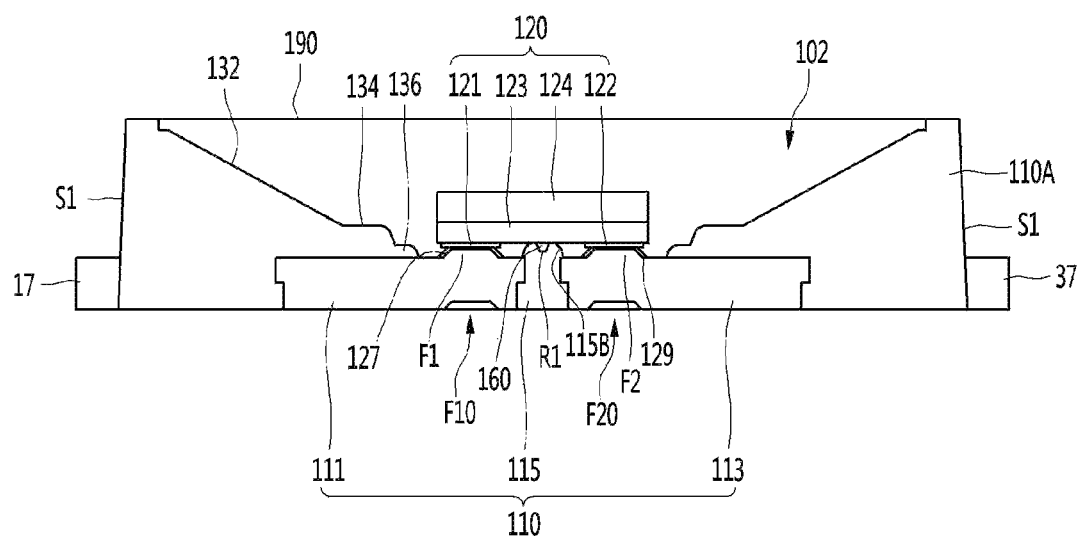
FIG. 29 is a side cross-sectional view of the light emitting device package of FIG. 28.
Figure 30:
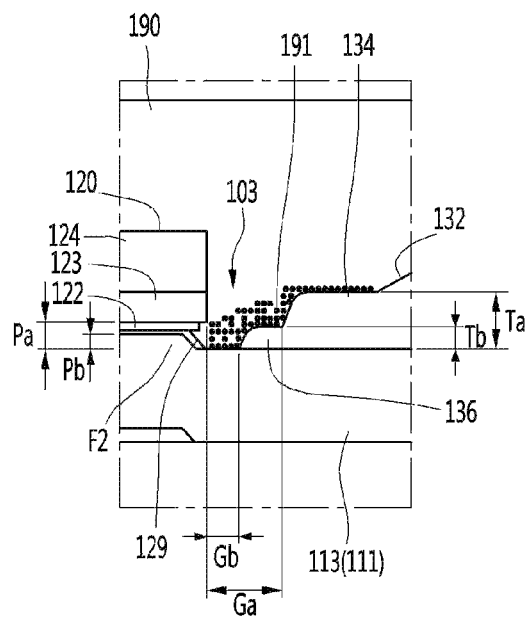
FIG. 30 is a view showing an example in which the phosphor is disposed on the inner surface of the cavity in the light emitting device package of FIG. 29.
Figure 31:
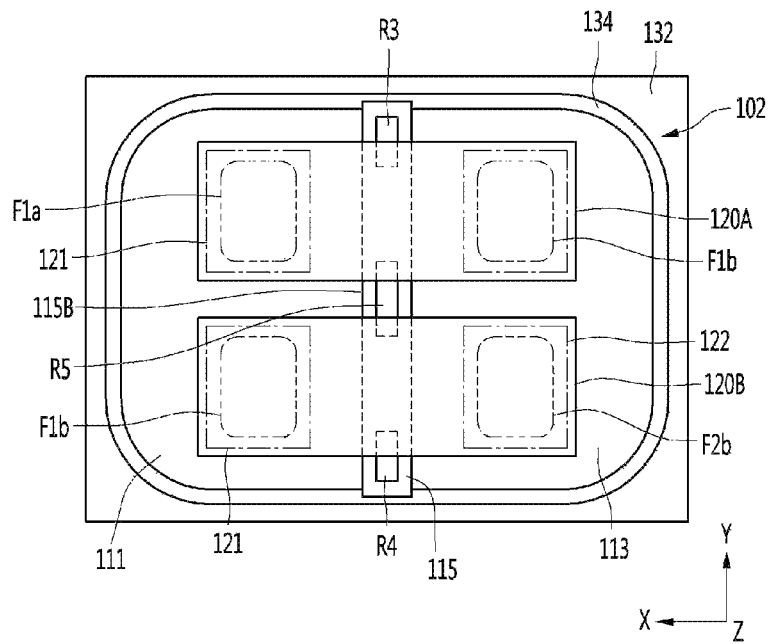
FIG. 31 is another example of the light emitting device package of FIG. 28.

FIGS. 29 to 31 show examples of other packages in FIGS. 21. 29 to 31, a reflective wall 134 and a sub-reflective wall 136 adjacent to the light emitting device 120 are disposed on a lower portion of the inner surface 132 of the cavity 102, and the reflective wall 134 and the sub-reflective wall 136 may reduce the process of disposing the second resin and improve the light reflection efficiency by a body material. That is, since the sub-reflective wall 136 having the same reflective resin material as the body extends to a region adjacent to the light emitting device 120 and covers the lower periphery of the light emitting device 120, the light loss may reduce on the lower periphery of the light emitting device 120. Referring to FIG. 30, the reflective wall 134 has a flat upper surface, and when the phosphor 191 added in the molding portion 190 precipitates, the phosphor 191 is accumulated on the flat upper surface and some phosphors 191 may be positioned as a peripheral region 103 of the light emitting device 120. In this case, since the inclination angle of the inner surface 132 of the cavity 102 may be inclined at a greater angle than the structure without the reflective wall 134, the phosphor 191 may be moved to the peripheral region 103. The reflective wall 134 may have the phosphor 191 distributed on a surface thereof. The sub-reflective wall 136 may have a flat upper surface and the phosphor 191 may be distributed on a surface thereof. The phosphors 191 disposed on the surfaces of the reflective walls 134 and the sub-reflective walls 136 are distributed in a larger amount in the peripheral region 103 of the light emitting device 120, thereby surrounding the light emitting device 120. The wavelength conversion efficiency in the region 103 may be improved. This is because the light emitting device 120 disposed in the form of a flip chip has an active layer positioned in a region adjacent to the frames 111 and 113, so that light of a predetermined amount or more is emitted in the lateral direction through the active layer. These side lights rarely travel through the surface of the frame and may be emitted by reflection by a resin or wavelength conversion by a phosphor.

The height Ta of the upper surface of the reflective wall 134 is disposed to a half point of the side height of the light emitting device 120 or a point between the upper and lower surfaces of the substrate 124, thereby facing to the light emitting structure 123 of the light emitting device 120. Accordingly, the phosphors 191 disposed on the reflective wall 134 may increase the wavelength conversion efficiency by light emitted from the side surface of the light emitting device 120. The height Ta of the upper surface of the reflective wall 134 may be 200 µm or less, for example, in a range of 120 to 200 µm, and when it is larger than the above range, wavelength conversion efficiency may be reduced and when it is smaller than the range, when it is smaller than the above range, an inclination angle of the side surface 132 may be reduced, thereby reducing the function of guiding the phosphor 191 to the peripheral region 103. The upper surface area or upper surface width of the reflective wall 134 may be greater than the upper surface area or upper surface width of the sub-reflective wall 136. The upper surface height Tb of the sub-reflective wall 136 may be smaller than the upper surface height Ta of the reflective wall 134. The sub-reflective wall 136 may be disposed closer to the light emitting device 120 than the reflective wall 134 and may be disposed at a lower height. Accordingly, the sub-reflective wall 136 extends in the direction of the first and second conductive protrusions F1 and F2 lower than the lower surface (excluding the bonding portion) of the light emitting device 120, and thus the exposed area of the frames 111 and 113 may be reduced. The reflective wall 134 may have an interval Ga of 300 μm or less, for example, in a range of 150 to 300 μm, from a side surface of the light emitting device 120. The sub-reflective wall 136 may have an interval Gb from a side surface of the light emitting device 120 of 80 μm or more, for example, in a range of 80 to 120 μm. The difference between the intervals Ga and Gb may be arranged in a range of 70 μm or more, for example, 70 to 120 μm. This is because the sub-reflective wall 136 has a width of 70 to 120 μm and extends from the reflective wall 134 in the direction of the first and second conductive protrusions F1 and F2, the exposed area of the upper surfaces of the frames 111 and 113 may be reduced, and the decrease in the light flux due to the discoloration of the frames 111 and 113 may prevent. The intervals Ga and Gb are examples of distances based on the first direction, and an interval of the second direction may be equal to or smaller than the distance in the first direction.

The height Tb of the sub-reflective wall 136 may be arranged in a range of 70 μm or less, for example, 30 to 70 μm, and when it is smaller than the above range, the shape of the sub-reflective wall 136 is not maintained and is difficult to form. When it is larger than the above range, the phosphor induction ratio may be lowered without a difference in height from the reflective wall 134, and light reflection efficiency may be lowered. The height of the upper surface of the sub-reflective wall 136 may be lower than that of the light emitting device 120. The height Tb of the sub-reflective wall 136 may be disposed to be equal to or higher than the thickness Pb of the first and second conductive protrusions F1 and F2 disclosed in the embodiment of the present invention. This provides the height Tb of the sub-reflective wall 136 to a predetermined thickness or more, thereby improving light reflection efficiency and preventing deterioration of adhesion to the frames 111 and 113. The inner surfaces of the first and sub-reflective walls 134 and 136 may include an inclined surface or a curved surface.

Referring to FIG. 31, the support portions 115B of the body 115 may be provided with recesses R3, R4 and R5. The plurality of conductive protrusions F1a, F2a, F1b, and F2b protruding from the respective frames 111 and 113 may correspond to the bonding portions 121 and 122 of the light emitting devices 120A and 120B, respectively. The plurality of recesses R3, R4, and R5 may include first and third recesses R3 and R5 disposed under the first light emitting device 120A, and second and third recesses R4 and R5 disposed under the second light emitting device 120B. The first and third recesses R3 and R5 may include an inner portion that partially overlaps the first light emitting device 120A and an outer portion that does not overlap. The second and third recesses R4 and R5 may include an inner portion overlapping a portion of the second light emitting device 120B and an outer portion not overlapping. The third recess R5 may be disposed between the first and second light emitting devices 120A and 120B and below the first and second light emitting devices 120A and 120B.

Configurations of the first and second embodiments, configurations of other examples, and configurations of modified examples may be selectively applied to or merged with other examples. For example, the through-holes and/or spacers of the body disclosed in the first embodiment may be selectively applied to other examples. One or a plurality of light emitting device packages according to an embodiment may be disposed on a circuit board and applied to a light source device. The light source device may include a display device, a lighting device, a head lamp, etc. according to the industrial field. Features, structures, effects, etc. described in the above embodiments are included in at least one embodiment, and are not necessarily limited to only one embodiment. Furthermore, features, structures, effects, and the like exemplified in each embodiment may be combined or modified for other embodiments by a person having ordinary knowledge in the field to which the embodiments belong. Therefore, contents related to such combinations and modifications should be interpreted as being included in the scope of the embodiment. Although the embodiments have been mainly described above, these are merely examples and do not limit the embodiments, and those who have ordinary knowledge in the field to which the embodiments belong may not be exemplified in the above without departing from the essential characteristics of this embodiment. You will see that it is possible to modify and apply branches. For example, each component specifically shown in the embodiment may be implemented by modification. In addition, the differences related to the modification and application should be interpreted as being included in the scope of the embodiment set in the appended claims.

What is claimed is:

1. A light emitting device package comprising:
   a first frame and a second frame spaced from each other and facing each other;
   a body disposed between the first frame and the second frame; and
   a light emitting device disposed on the first frame and the second frame,
   wherein the first frame includes a first end portion adjacent to the second frame,
   wherein the second frame includes a second end portion disposed adjacent to the first frame, and facing the first end portion,
   wherein the first end portion includes a first protrusion protruding toward the second frame,
   wherein the second end portion includes a second protrusion protruding toward the first frame,
   wherein the light emitting device includes a first bonding portion disposed on the first protrusion, and a second bonding portion disposed on the second protrusion,
   wherein the body includes first and second recesses spaced apart from each other and disposed between the first and second frames, and
   wherein the first and second recesses include an inner portion overlapping the light emitting device in a vertical direction and an outer portion extending outward from a side surface of the light emitting device.

2. The light emitting device package of claim 1, wherein the body includes a support portion more protruding than the first and second protrusions.

3. The light emitting device package of claim 1, wherein a conductive portion is disposed between the first bonding portion of the light emitting device and the first frame, and between the second bonding portion of the light emitting device and the second frame.

4. The light emitting device package of claim 1, further comprising an upper body disposed around the body and an upper portion of the first and second frames, and
wherein the upper body includes a cavity in which the light emitting device is disposed.

5. The light emitting device package of claim 1, further comprising:
a first resin disposed between the light emitting device and the body,
a second resin around a lower portion of the light emitting device, and
a reflective wall adjacent to a side surface of the light emitting device.

6. The light emitting device package of claim 5, further comprising a through hole vertically penetrating between the first and second protrusions in the body.

7. The light emitting device package of claim 1, wherein the body includes first and second reflective portions extending toward both sides of the first protrusion toward the first frame, and third and fourth reflective portions extending toward both sides of the second protrusion toward the second frame,
wherein the first and second frames include conductive material,
wherein the body, and the first to fourth reflective portions include insulating material,
wherein the first protrusion is disposed between the first and second reflective portions,
wherein the second protrusion is disposed between the third and fourth reflective portions, and
wherein the light emitting device overlaps the first to fourth reflective portions in a vertical direction.

8. The light emitting device package of claim 7, wherein the first end portion of the first frame includes third and fourth protrusions spaced on both sides of the first protrusion and protruding in a direction of the second frame,
wherein the second end portion of the second frame includes fifth and sixth protrusions spaced on both sides of the second protrusion and protruding in a direction of the first frame, and
wherein the first reflective portion is disposed between the first and third protrusions, the second reflective portion is disposed between the first and fourth protrusions, the third reflective portion is disposed between the second and fifth protrusions, and the fourth reflective portion is disposed between the second and sixth protrusions.

9. A light emitting device package comprising:
a first frame and a second frame spaced from each other and facing each other;
a body disposed between the first frame and the second frame; and
a light emitting device disposed on the first frame and the second frame,
wherein the first frame includes a first end portion adjacent to the second frame,
wherein the second frame includes a second end portion disposed adjacent to the first frame, and facing the first end portion,
wherein the first end portion includes a first protrusion protruding toward the second frame,
wherein the second end portion includes a second protrusion protruding toward the first frame,
wherein the light emitting device includes a first bonding portion disposed on the first protrusion, and a second bonding portion disposed on the second protrusion,
wherein the body includes a plurality of spacers respectively disposed on a lower surface of a corner portion of the light emitting device, and
wherein the plurality of spacers separates the light emitting device from upper surfaces of the first and second frames.

10. The light emitting device package of claim 9, wherein the body includes a support portion spaced apart from the plurality of spacers and protruding to a thickness thinner than a thickness of the spacers, and
wherein the support portion is disposed between the first and second bonding portions of the light emitting device.

11. A light emitting device package comprising:
a first frame and a second frame spaced from each other and facing each other;
a body disposed between the first frame and the second frame; and
a light emitting device disposed on the body,
wherein the first frame includes a first conductive protrusion protruding from an upper surface of the first frame toward the light emitting device,
wherein the second frame includes a second conductive protrusion protruding from an upper surface of the second frame toward the light emitting device,
wherein the first and second conductive protrusions overlap the light emitting device in a vertical direction,
wherein upper surfaces of the first and second conductive protrusions are disposed higher than the upper surfaces of the first and second frames,
wherein the light emitting device includes a first bonding portion facing the first conductive protrusion, and a second bonding portion facing the second conductive protrusion, and
wherein the body includes a support portion between the first and second conductive protrusions and protruding toward the light emitting device.

12. The light emitting device package of claim 11, further comprising an upper body disposed around the body and an upper portion of the first and second frames,
wherein the upper body includes a cavity in which the light emitting device is disposed, and
wherein an inner surface of the cavity includes a reflective wall extending in an inner direction and having a flat top surface.

13. The light emitting device package of claim 11, wherein the support portion protruding toward the light emitting device has a length longer than a length of the first conductive protrusion or the second conductive protrusion.

14. The light emitting device package of claim 11, wherein the body includes first and second recesses spaced apart from each other between the first and second frames, and
wherein the first and second recesses include an inner portion overlapping the light emitting device in a vertical direction and an outer portion extending outward from a side surface of the light emitting device.

15. The light emitting device package of claim 11, wherein a conductive portion is disposed between the first bonding portion of the light emitting device and the first frame, and between the second bonding portion of the light emitting device and the second frame.

16. The light emitting device package of claim 11, wherein the support portion protrudes more than the upper surfaces of the first and second frames and disposed between the first and second frames,
- wherein the support portion has a first height relative to the upper surface of the first frame,
- wherein the first and second conductive protrusions have a second height based on the upper surface of the first frame,
- wherein the first height is disposed higher than the second height, and
- wherein an upper surface of the support portion has higher height than upper surfaces of the first and second bonding portion based on the upper surface of the first frame.

17. The light emitting device package of claim 11, further comprising a first resin disposed between the light emitting device and the body, a second resin around a lower portion of the light emitting device, and a reflective wall adjacent to a side surface of the light emitting device.

18. The light emitting device package of claim 17, further comprising a through hole vertically penetrated in the body.

19. The light emitting device package of claim 11, wherein the body includes a plurality of spacers respectively disposed on a lower surface of a corner portion of the light emitting device, and
- wherein the plurality of spacers separates the light emitting device from the upper surfaces of the first and second frames.

20. The light emitting device package of claim 19, wherein the support portion is spaced apart from the plurality of spacers and protruding to a thickness less than a thickness of the spacer, and
- wherein the support portion is disposed between the first and second bonding portions of the light emitting device.

* * * * *